US012445125B2

(12) United States Patent
Tabei

(10) Patent No.: US 12,445,125 B2
(45) Date of Patent: Oct. 14, 2025

(54) SWITCHING CIRCUIT

(71) Applicant: Murata Manufacturing Co., Ltd., Kyoto (JP)

(72) Inventor: Makoto Tabei, Kyoto (JP)

(73) Assignee: MURATA MANUFACTURING CO., LTD., Kyoto (JP)

(*) Notice: Subject to any disclaimer, the term of this patent is extended or adjusted under 35 U.S.C. 154(b) by 152 days.

(21) Appl. No.: 18/461,749

(22) Filed: Sep. 6, 2023

(65) Prior Publication Data
US 2024/0097674 A1 Mar. 21, 2024

(30) Foreign Application Priority Data

Sep. 16, 2022 (JP) ................................. 2022-148497

(51) Int. Cl.
H03K 17/56 (2006.01)
H03K 5/1252 (2006.01)

(52) U.S. Cl.
CPC ........... *H03K 17/56* (2013.01); *H03K 5/1252* (2013.01)

(58) Field of Classification Search
CPC .. H03K 17/693; H03K 17/063; H03K 17/102; H03K 17/6871; H03K 17/162; H03K 17/163; H03K 17/165; H03K 17/56; H03K 17/6872; H03K 2217/0054; H03K 17/04123; H03K 17/04206; H03K 17/08; H03K 17/08122; H03K 17/122; H03K 7/161; H03K 2017/066; H02M 1/08; H02M 1/0029; H02M 1/0003; H02M 3/158; H02M 3/1588
See application file for complete search history.

(56) References Cited

U.S. PATENT DOCUMENTS 4,961,015 A * 10/1990 Shin ..................... H03K 17/162
327/437
2016/0020760 A1* 1/2016 Li ........................ H03K 17/161
327/382

(Continued)

FOREIGN PATENT DOCUMENTS

WO 2021/039083 A1 3/2021

OTHER PUBLICATIONS

C.-M. Hu et al., "Design of an RF Transmit/Receive Switch Using LDMOSFETs With High Power Capability and Low Insertion Loss ," in IEEE Transactions on Electron Devices, vol. 58, No. 6, pp. 1722-1727, doi: 10.1109/TED.2011.2127481 (Year: 2011).*

*Primary Examiner* — Lincoln D Donovan
*Assistant Examiner* — Tyler J Pereny
(74) *Attorney, Agent, or Firm* — McDonald Hopkins LLC

(57) ABSTRACT

A switching circuit includes: a substrate including input-and-output terminals; a switch provided to the substrate and including a source terminal, a gate terminal, and a drain terminal, the source terminal being connected to an input end of a power amplifier, the drain terminal being connected to a first input-and-output terminal; a voltage control circuit provided to the substrate and connected to the gate terminal; a switch provided to the substrate and including a source terminal, a gate terminal, and a drain terminal, the source terminal being connected to a second input-and-output terminal, the drain terminal being connected to an output end of the power amplifier; and a voltage control circuit provided to the substrate to be apart from the voltage control circuit and connected to the gate terminal.

17 Claims, 8 Drawing Sheets

(56) References Cited

U.S. PATENT DOCUMENTS

| | | |
|---|---|---|
| 2017/0047963 A1* | 2/2017 | Hayakawa .............. H04B 1/44 |
| 2018/0226367 A1 | 8/2018 | Babcock et al. |
| 2022/0173754 A1 | 6/2022 | Tsuda |

\* cited by examiner

SWITCHING CIRCUIT

CROSS REFERENCE TO RELATED APPLICATION

This application claims priority from Japanese Patent Application No. 2022-148497 filed on Sep. 16, 2022. The content of this application is incorporated herein by reference in its entirety.

BACKGROUND

The present disclosure relates to a switching circuit.

Generally, a mobile communication device is equipped with a plurality of switches. For example, U.S. Patent Application Publication No. 2018/0226367 discloses a switching circuit which switches a power amplifier and a low noise amplifier.

BRIEF SUMMARY

However, in the conventional technology, isolation between a plurality of terminals included in the switching circuit may be insufficient.

Therefore, the present disclosure provides a switching circuit capable of improving isolation between terminals.

A switching circuit according to an aspect of the present disclosure includes: a substrate including a first input-and-output terminal and a second input-and-output terminal; a first switch provided to the substrate and including a first source terminal, a first gate terminal, and a first drain terminal, the first source terminal being connected to an input end of a power amplifier, the first drain terminal being connected to the first input-and-output terminal; a first voltage control circuit provided to the substrate and connected to the first gate terminal; a second switch provided to the substrate and including a second source terminal, a second gate terminal, and a second drain terminal, the second source terminal being connected to the second input-and-output terminal, the second drain terminal being connected to an output end of the power amplifier; and a second voltage control circuit provided to the substrate to be apart from the first voltage control circuit and connected to the second gate terminal.

A switching circuit according to another aspect of the present disclosure is a switching circuit of an SPnT type and includes: a substrate including a common terminal, a first selection terminal, and a second selection terminal; a first switch provided to the substrate and including a first source terminal, a first gate terminal, and a first drain terminal, the first drain terminal being connected to the common terminal, the first source terminal being connected to the first selection terminal; a first voltage control circuit provided to the substrate and connected to the first gate terminal; a second switch provided to the substrate and including a second source terminal, a second gate terminal, and a second drain terminal, the second drain terminal being connected to the common terminal, the second source terminal being connected to the second selection terminal; and a second voltage control circuit provided to the substrate to be apart from the first voltage control circuit and connected to the second gate terminal.

According to the present disclosure, isolation between the terminals can be improved.

DETAILED DESCRIPTION

Figure 1:
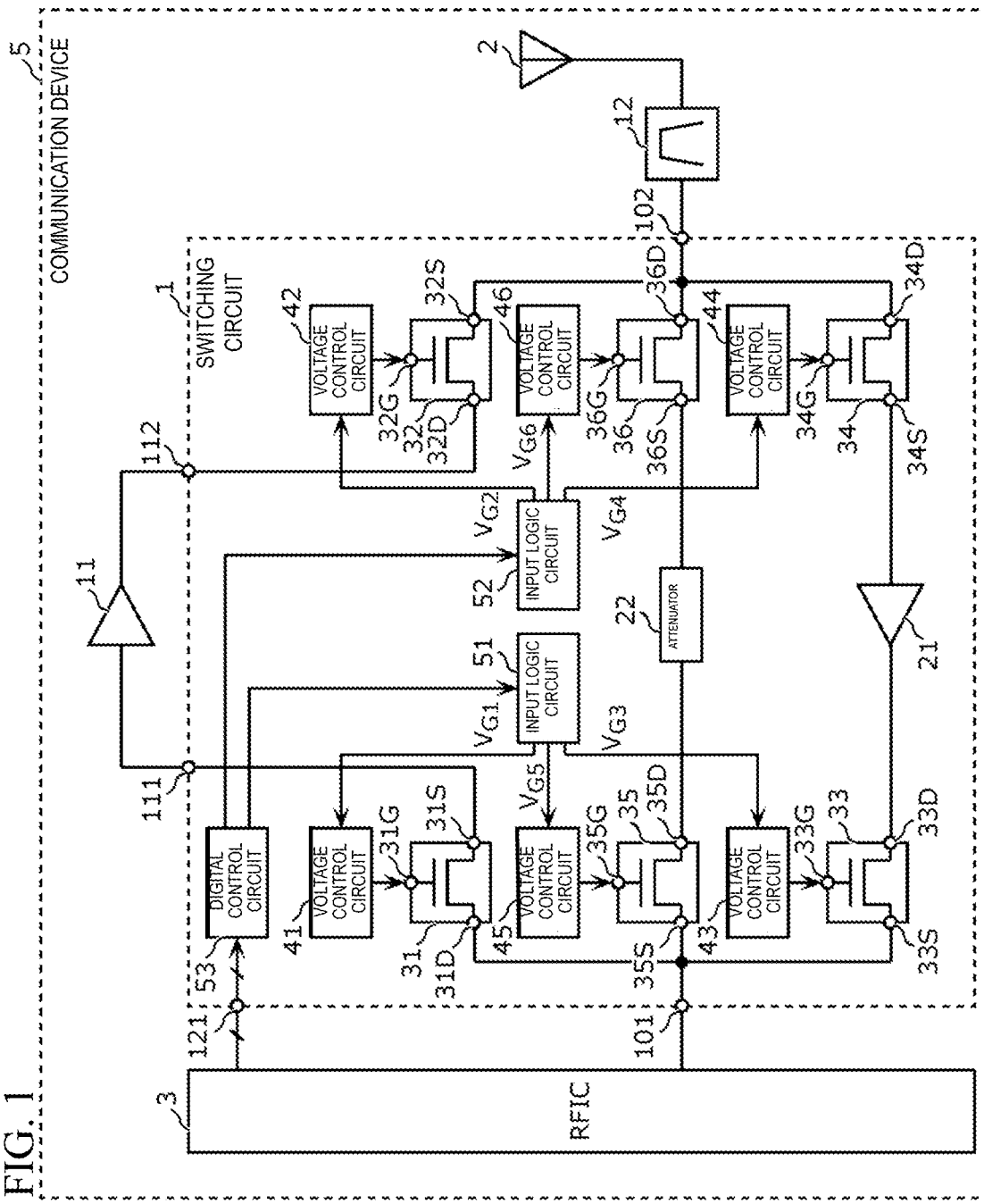
FIG. 1 is a circuit configuration diagram of a communication device according to Embodiment 1.

Hereinafter, embodiments of the present disclosure are described in detail with reference to the drawings. Note that the embodiments described below illustrate comprehensive or concrete examples. Numerical values, shapes, material, components, and arrangement and connection configurations of the components described in the following embodiments are merely examples, and not intended to limit the present disclosure.

Note that each of the drawings is a schematic drawing in which emphasis, omission, or ratio adjustment are suitably applied in order to illustrate the present disclosure. The drawings do not necessarily illustrate exactly, but may illustrate differently from the actual size, positional relation, and ratio. In the drawings, the same reference characters are given to substantially the same configurations, and redundant description may be omitted or simplified.

In each drawing below, an x axis and a y axis are axes orthogonal to each other on a plane parallel to a principal surface of a substrate. Specifically, when the substrate has a rectangular shape in plan view, the x axis is parallel to a first side of the substrate, and the y axis is parallel to a second side orthogonal to the first side of the substrate. Moreover, a z axis is an axis perpendicular to the principal surface of the substrate, and its positive direction indicates an upper direction and its negative direction indicates a lower direction.

In circuit configurations of the present disclosure, "being connected" includes not only a case of directly being connected using a connection terminal and/or a wiring conductor, but also a case of electrically being connected with another circuit element interposed. "Being connected between A and B" means to be connected to both of A and B between A and B, and means to be disposed in series on a path connecting A and B.

In the circuit configurations of the present disclosure, a "terminal" means a point where a conductor within an element ends. Note that when impedance of a conductor between elements is sufficiently low, a terminal is interpreted as not only a single point, but also an arbitrary point on the conductor between the elements or the entire conductor.

In component arrangement of the present disclosure, "a component being provided to a substrate" includes not only that a component is disposed on a substrate while the component being in contact with the substrate, but also that the component is provided above the substrate without necessarily contacting the substrate (for example, the component is stacked on another component which is disposed on the substrate), and that the component is disposed in a state in which a portion of or the entire component is embedded in the substrate.

Moreover, in the component arrangement of the present disclosure, "distance between A and B" means the shortest distance between A and B. That is, "distance between A and B" means a length of the shortest line segment among a plurality of line segments connecting an arbitrary point on a surface of A and an arbitrary point on a surface of B.

Moreover, terms describing relation of elements, such as "parallel" and "vertical", terms describing the shapes of elements, such as "rectangular", and numerical value ranges do not only indicate exact meanings, but also include meanings within a substantially equivalent range (for example, including a margin of error of a few percent).

Embodiment 1

Embodiment 1 is described. A communication device 5 according to this embodiment corresponds to user equipment (UE) or a wireless local area network (WLAN) device in a cellular network or a WLAN, and is typically a cellular phone, a smartphone, a tablet computer, a wearable device, or the like. Note that the communication device 5 may be an internet of things (IoT) sensor device, a medical/healthcare device, a vehicle, an unmanned aerial vehicle (UAV) (so called a drone), or an automated guided vehicle (AGV).

Circuit configurations of the communication device 5 and a switching circuit 1 according to this embodiment are described with reference to FIG. 1. FIG. 1 is a circuit configuration diagram of the communication device 5 according to this embodiment.

Note that FIG. 1 shows an example of the circuit configuration, and the communication device 5 and the switching circuit 1 may be implemented using any of great variety of circuit mountings and circuit techniques. Therefore, description of the communication device 5 and the switching circuit 1 given blow should not be interpreted as limitation.

1.1 Circuit Configuration of Communication Device 5

First, the circuit configuration of the communication device 5 according to this embodiment is described with reference to FIG. 1. The communication device 5 includes the switching circuit 1, an antenna 2, a radio frequency integrated circuit (RFIC) 3, a power amplifier 11, and a filter 12.

The switching circuit 1 transmits a high frequency signal between the antenna 2 and the RFIC 3. The circuit configuration of the switching circuit 1 will be described later.

The antenna 2 is connected to one end of the filter 12. The antenna 2 outputs, to the outside, a high frequency signal supplied from the switching circuit 1 through the filter 12. Moreover, the antenna 2 receives a high frequency signal from the outside of the communication device 5, and supplies the high frequency signal to the switching circuit 1. Note that the antenna 2 is not necessarily included in the communication device 5. Moreover, the communication device 5 may include, in addition to the antenna 2, another one or more antennas.

The RFIC 3 is one example of a signal processing circuit which processes a high frequency signal. Specifically, the RFIC 3 executes signal processing by upconversion or the like, to a transmission signal inputted from a baseband integrated circuit (BBIC) (not illustrated), and outputs, to the switching circuit 1, a high frequency transmission signal generated through the signal processing. Moreover, the RFIC 3 may execute signal processing by downconversion or the like, to a high frequency reception signal inputted via a reception path of the switching circuit 1, and outputs, to the BBIC, a reception signal generated through the signal processing. Furthermore, the RFIC 3 includes a controller which controls the switching circuit 1 and/or the power amplifier 11 or the like. Note that a portion of or the entire function as the controller of the RFIC 3 may be configured at the outside of the RFIC 3, and for example, may be configured in the switching circuit 1.

The power amplifier 11 is connected to the switching circuit 1. Specifically, an input end of the power amplifier 11 is connected to a PA connection terminal 111 of the switching circuit 1, and an output end of the power amplifier 11 is connected to a PA connection terminal 112 of the switching circuit 1. In this connection configuration, the power amplifier 11 can amplify an input signal (transmission signal) received from the RFIC 3 via the PA connection terminal 111 and a switch 31, using power supplied from a power supply (not illustrated). Then, the power amplifier 11 can output the amplified transmission signal to the antenna 2 via the PA connection terminal 112, a switch 32, and an input-and-output terminal 102. Note that the power amplifier 11 may be included in the switching circuit 1.

The filter 12 is a band pass filter having a pass band including a given transmission band. Note that the filter 12 is not limited to be a band pass filter, but may be a low pass filter or a high pass filter. The filter 12 is connected between the input-and-output terminal 102 of the switching circuit 1 and the antenna 2. Specifically, one end of the filter 12 is connected to the antenna 2, and the other end of the filter 12 is connected to the input-and-output terminal 102. Note that the filter 12 is not necessarily included in the communication device 5.

The given band is a frequency band for a communication system which is established by using a radio access technology (RAT). The given band is defined in advance by, for example, standards organizations (for example, The 3rd Generation Partnership Project (3GPP®), and Institute of Electrical and Electronics Engineers (IEEE)). Examples of the communication system are the 5th generation new radio (5GNR) system, the long term evolution (LTE) system, the wireless local area network (WLAN) system, and the like.

1.2 Circuit Configuration of Switching Circuit 1

Next, the circuit configuration of the switching circuit 1 according to this embodiment is described with reference to FIG. 1. The switching circuit 1 includes a low noise amplifier 21, an attenuator 22, switches 31 to 36, voltage control circuits 41 to 46, input logic circuits 51 and 52, a digital control circuit 53, input-and-output terminals 101 and 102, the PA connection terminals 111 and 112, and a controlling terminal 121.

The input-and-output terminal 101 is one example of a first input-and-output terminal, and is an external connection terminal (RFIC connection terminal) of the switching circuit 1. The input-and-output terminal 101 functions as an input terminal which receives a transmission signal from the RFIC 3, and also functions as an output terminal which supplies a reception signal to the RFIC 3. The input-and-output terminal 101 is connected to the RFIC 3 at the outside of the switching circuit 1, and is connected to the switches 31, 33, and 35 at the inside of the switching circuit 1.

The input-and-output terminal 102 is one example of a second input-and-output terminal, and is an external connection terminal (antenna connection terminal) of the switching circuit 1. The input-and-output terminal 102 functions as an output terminal which supplies a transmission signal to the antenna 2, and also functions as an input terminal which receives a reception signal from the antenna 2. The input-and-output terminal 102 is connected to the other end of the filter 12 at the outside of the switching circuit 1, and is connected to the switches 32, 34, and 36 at the inside of the switching circuit 1.

The PA connection terminal 111 is an external connection terminal of the switching circuit 1, and functions as an output terminal which supplies a transmission signal to the power amplifier 11. The PA connection terminal 111 is connected to the input end of the power amplifier 11 at the outside of the switching circuit 1, and is connected to the input-and-output terminal 101 with the switch 31 interposed therebetween at the inside of the switching circuit 1.

The PA connection terminal 112 is an external connection terminal of the switching circuit 1, and functions as an input terminal which receives an amplified transmission signal from the power amplifier 11. The PA connection terminal 112 is connected to the output end of the power amplifier 11 at the outside of the switching circuit 1, and is connected to the input-and-output terminal 102 with the switch 32 interposed therebetween at the inside of the switching circuit 1.

The controlling terminal 121 is an external connection terminal of the switching circuit 1, and functions as an input terminal which receives a digital control signal from the RFIC 3. The controlling terminal 121 is connected to the RFIC 3 at the outside of the switching circuit 1, and is connected to the digital control circuit 53 at the inside of the switching circuit 1. Note that the controlling terminal 121 may include a plurality of terminals. In this case, the plurality of terminals which constitute the controlling terminal 121 may include a terminal which receives a clock signal, and a terminal which receives a data signal.

The low noise amplifier 21 is connected between the input-and-output terminals 101 and 102. Specifically, an input end of the low noise amplifier 21 is connected to the input-and-output terminal 102 with the switch 34 interposed therebetween. An output end of the low noise amplifier 21 is connected to the input-and-output terminal 101 with the switch 33 interposed therebetween. In this connection configuration, the low noise amplifier 21 can amplify an input signal (reception signal) received from the antenna 2 via the input-and-output terminal 102 and the switch 34, using power supplied from a power supply (not illustrated). Then, the low noise amplifier 21 can supply the amplified reception signal to the RFIC 3 via the switch 33 and the input-and-output terminal 101. Note that the low noise amplifier 21 is not necessarily included in the switching circuit 1.

The attenuator 22 is connected between the input-and-output terminals 101 and 102. Specifically, one end of the attenuator 22 is connected to the input-and-output terminal 101 with the switch 35 interposed therebetween. The other end of the attenuator 22 is connected to the input-and-output terminal 102 with the switch 36 interposed therebetween. In this connection configuration, the attenuator 22 can attenuate an input signal (reception signal) received from the antenna 2 via the input-and-output terminal 102 and the switch 36. Then, the attenuator 22 can supply the attenuated reception signal to the RFIC 3 via the switch 35 and the input-and-output terminal 101. Note that the attenuator 22 is not necessarily included in the switching circuit 1.

The switch 31 is one example of a first switch, and is connected between the input-and-output terminal 101 and the power amplifier 11. Specifically, the switch 31 includes a source terminal 31S, a gate terminal 31G, and a drain terminal 31D. The source terminal 31S is one example of a first source terminal, and is connected to the input end of the power amplifier 11 with the PA connection terminal 111 interposed therebetween. The gate terminal 31G is one example of a first gate terminal, and is connected to the voltage control circuit 41. The drain terminal 31D is one example of a first drain terminal, and is connected to the input-and-output terminal 101.

In this configuration, the switch 31 can switch connection and disconnection between the source terminal 31S and the drain terminal 31D based on a gate voltage $V_{G1}$ supplied from the voltage control circuit 41. For example, the switch 31 is configured by a switching circuit of a single-pole single-throw (SPST) type.

The switch 32 is one example of a second switch, and is connected between the power amplifier 11 and the input-and-output terminal 102. Specifically, the switch 32 includes a source terminal 32S, a gate terminal 32G, and a drain terminal 32D. The source terminal 32S is one example of a second source terminal, and is connected to the input-and-output terminal 102. The gate terminal 32G is one example of a second gate terminal, and is connected to the voltage control circuit 42. The drain terminal 32D is one example of a second drain terminal, and is connected to the output end of the power amplifier 11 with the PA connection terminal 112 interposed therebetween.

In this configuration, the switch 32 can switch connection and disconnection between the source terminal 32S and the drain terminal 32D based on a gate voltage $V_{G2}$ supplied from the voltage control circuit 42. For example, the switch 32 is configured by a switching circuit of an SPST type.

The switch 33 is one example of a third switch, and is connected between the low noise amplifier 21 and the input-and-output terminal 101. Specifically, the switch 33 includes a source terminal 33S, a gate terminal 33G, and a drain terminal 33D. The source terminal 33S is one example of a third source terminal, and is connected to the input-and-output terminal 101. The gate terminal 33G is one example of a third gate terminal, and is connected to the voltage control circuit 43. The drain terminal 33D is one example of a third drain terminal, and is connected to the output end of the low noise amplifier 21.

In this configuration, the switch 33 can switch connection and disconnection between the source terminal 33S and the drain terminal 33D based on a gate voltage $V_{G3}$ supplied from the voltage control circuit 43. For example, the switch 33 is configured by a switching circuit of an SPST type.

The switch 34 is one example of a fourth switch, and is connected between the input-and-output terminal 102 and the low noise amplifier 21. Specifically, the switch 34 includes a source terminal 34S, a gate terminal 34G, and a drain terminal 34D. The source terminal 34S is one example of a fourth source terminal, and is connected to the input end of the low noise amplifier 21. The gate terminal 34G is one example of a fourth gate terminal, and is connected to the voltage control circuit 44. The drain terminal 34D is one example of a fourth drain terminal, and is connected to the input-and-output terminal 102.

In this configuration, the switch 34 can switch connection and disconnection between the source terminal 34S and the drain terminal 34D based on a gate voltage $V_{G4}$ supplied from the voltage control circuit 44. For example, the switch 34 is configured by a switching circuit of an SPST type.

The switch 35 is one example of a fifth switch, and is connected between the attenuator 22 and the input-and-output terminal 101. Specifically, the switch 35 includes a source terminal 35S, a gate terminal 35G, and a drain terminal 35D. The source terminal 35S is one example of a fifth source terminal, and is connected to the input-and-output terminal 101. The gate terminal 35G is one example of a fifth gate terminal, and is connected to the voltage control circuit 45. The drain terminal 35D is one example of a fifth drain terminal, and is connected to the one end of the attenuator 22.

In this configuration, the switch 35 can switch connection and disconnection between the source terminal 35S and the drain terminal 35D based on a gate voltage $V_{G5}$ supplied from the voltage control circuit 45. For example, the switch 35 is configured by a switching circuit of an SPST type.

The switch 36 is one example of a sixth switch, and is connected between the input-and-output terminal 102 and the attenuator 22. Specifically, the switch 36 includes a source terminal 36S, a gate terminal 36G, and a drain terminal 36D. The source terminal 36S is one example of a sixth source terminal, and is connected to the other end of the attenuator 22. The gate terminal 36G is one example of a sixth gate terminal, and is connected to the voltage control circuit 46. The drain terminal 36D is one example of a sixth drain terminal, and is connected to the input-and-output terminal 102.

In this configuration, the switch 36 can switch connection and disconnection between the source terminal 36S and the drain terminal 36D based on a gate voltage $V_{G6}$ supplied from the voltage control circuit 46. For example, the switch 36 is configured by a switching circuit of an SPST type.

Note that although, in each of the switches 31 to 36, the source terminal and the drain terminal are referred to while being distinguished based on the flowing direction of a signal (electron) for convenience, they are not necessarily distinguished. Moreover, when the low noise amplifier 21 is not included in the switching circuit 1, the switches 33 and 34 are not necessarily included in the switching circuit 1. Moreover, when the attenuator 22 is not included in the switching circuit 1, the switches 35 and 36 are not necessarily included in the switching circuit 1.

The voltage control circuit 41 is one example of a first voltage control circuit, and is connected to the input logic circuit 51 and the gate terminal 31G. The voltage control circuit 41 can apply the gate voltage $V_{G1}$ to the gate terminal 31G based on an output signal of the input logic circuit 51.

The voltage control circuit 42 is one example of a second voltage control circuit, and is connected to the input logic circuit 52 and the gate terminal 32G. The voltage control circuit 42 can apply the gate voltage $V_{G2}$ to the gate terminal 32G based on an output signal of the input logic circuit 52.

The voltage control circuit 43 is one example of a third voltage control circuit, and is connected to the input logic circuit 51 and the gate terminal 33G. The voltage control circuit 43 can apply the gate voltage $V_{G3}$ to the gate terminal 33G based on an output signal of the input logic circuit 51.

The voltage control circuit 44 is one example of a fourth voltage control circuit, and is connected to the input logic circuit 52 and the gate terminal 34G. The voltage control circuit 44 can apply the gate voltage $V_{G4}$ to the gate terminal 34G based on an output signal of the input logic circuit 52.

The voltage control circuit 45 is one example of a fifth voltage control circuit, and is connected to the input logic circuit 51 and the gate terminal 35G. The voltage control circuit 45 can apply the gate voltage $V_{G5}$ to the gate terminal 35G based on an output signal of the input logic circuit 51.

The voltage control circuit 46 is one example of a sixth voltage control circuit, and is connected to the input logic circuit 52 and the gate terminal 36G. The voltage control circuit 46 can apply the gate voltage $V_{G6}$ to the gate terminal 36G based on an output signal of the input logic circuit 52.

As the voltage control circuits 41 to 46, for example, a level shifter is used. Note that the voltage control circuits 41 to 46 are not limited to the level shifter.

Note that when the switches 33 and 34 are not included in the switching circuit 1, the voltage control circuits 43 and 44 are not necessarily included in the switching circuit 1. Moreover, when the switches 35 and 36 are not included in the switching circuit 1, the voltage control circuits 45 and 46 are not necessarily included in the switching circuit 1.

The input logic circuit 51 is one example of a first input logic circuit, and is connected to the voltage control circuits 41, 43, and 45. The input logic circuit 51 can output control signals to the voltage control circuits 41, 43, and 45 based on an output signal of the digital control circuit 53. That is, the input logic circuit 51 can generate the control signals for the voltage control circuits 41, 43, and 45 by processing the control signal for the input logic circuit 51 outputted from the digital control circuit 53.

The input logic circuit 52 is one example of a second input logic circuit, and is connected to the voltage control circuits 42, 44, and 46. The input logic circuit 52 can output control signals to the voltage control circuits 42, 44, and 46 based on an output signal of the digital control circuit 53. That is, the input logic circuit 52 can generate the control signals for the voltage control circuits 42, 44, and 46 by processing the control signal for the input logic circuit 52 outputted from the digital control circuit 53.

Note that the input logic circuits 51 and 52 may be embodied by a single input logic circuit, or may be embodied by three or more input logic circuits. For example, a single input logic circuit may be connected to the voltage control circuits 41 to 46, and may output control signals to the voltage control circuits 41 to 46.

The digital control circuit 53 is connected to the input logic circuits 51 and 52. The digital control circuit 53 can transmit control signals to the input logic circuits 51 and 52 based on a digital control signal received from the RFIC 3 via the controlling terminal 121. That is, the digital control circuit 53 can generate the control signals for the input logic circuits 51 and 52 by processing the digital control signal. As the digital control signal, a source-synchronous digital control signal may be used. Note that the digital control signal is not limited to the source-synchronous control signal. For example, a clock-embedded control signal may be used as the digital control signal.

1.3 Circuit Configuration of Switches 31 to 36

Figure 2:
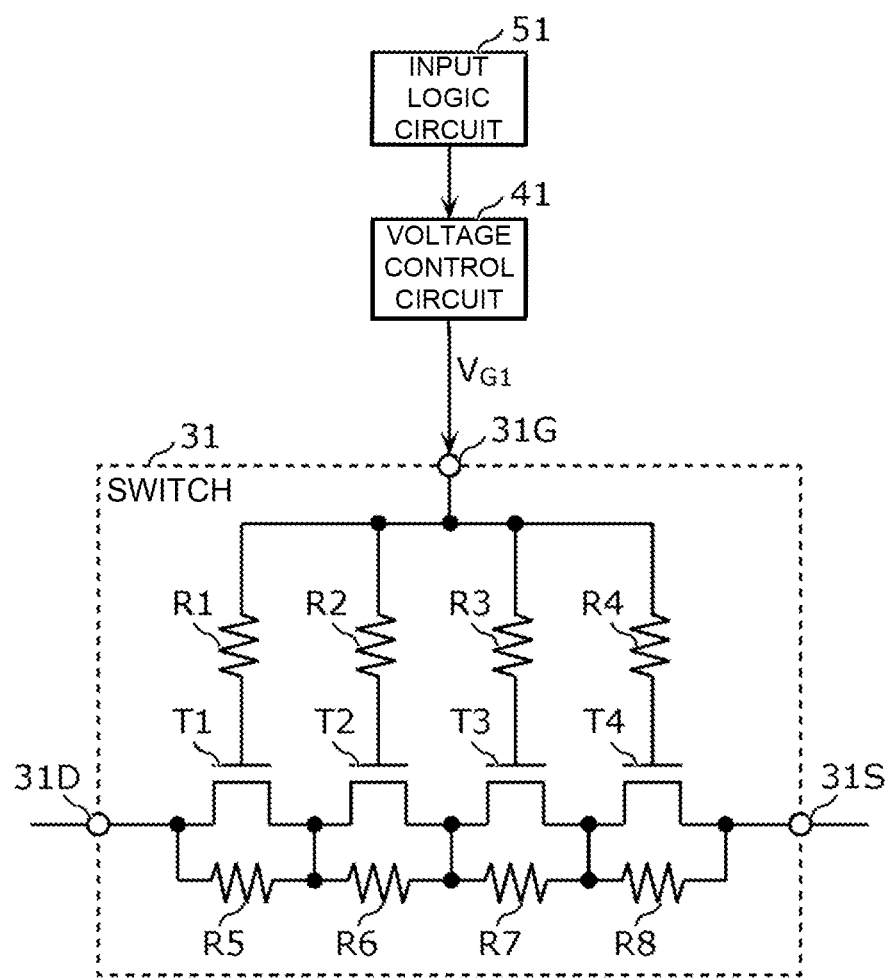
FIG. 2 is a circuit configuration diagram of a switch according to Embodiment 1.

Next, a circuit configuration of the switch 31 is described with reference to FIG. 2. FIG. 2 is a circuit configuration diagram of the switch 31 according to this embodiment.

Note that FIG. 2 shows an example of the circuit configuration, and the switch 31 may be implemented using any of great variety of circuit mountings and circuit techniques. Therefore, description of the switch 31 given blow should not be interpreted as limitation. Moreover, since circuit configurations of the switches 32 to 36 are similar to the circuit configuration of the switch 31, illustration and description thereof are omitted.

The switch 31 includes transistors T1 to T4, and resistors R1 to R8. The transistors T1 to T4 are field effect transistors, and are connected in series between the drain terminal 31D and the source terminal 31S of the switch 31.

A drain end of the transistor T1 is connected to the drain terminal 31D of the switch 31, and a source end of the transistor T1 is connected to a drain end of the transistor T2. Moreover, a gate end of the transistor T1 is connected to the gate terminal 31G of the switch 31 with the resistor R1 interposed therebetween, and the drain end of the transistor T1 is connected to the source end of the transistor T1 with the resistor R5 interposed therebetween.

The drain end of the transistor T2 is connected to the source end of the transistor T1, and a source end of the transistor T2 is connected to a drain end of the transistor T3. Moreover, a gate end of the transistor T2 is connected to the gate terminal 31G of the switch 31 with the resistor R2 interposed therebetween, and the drain end of the transistor T2 is connected to the source end of the transistor T2 with the resistor R6 interposed therebetween.

The drain end of the transistor T3 is connected to the source end of the transistor T2, and a source end of the transistor T3 is connected to a drain end of the transistor T4. Moreover, a gate end of the transistor T3 is connected to the gate terminal 31G of the switch 31 with the resistor R3 interposed therebetween, and the drain end of the transistor T3 is connected to the source end of the transistor T3 with the resistor R7 interposed therebetween.

The drain end of the transistor T4 is connected to the source end of the transistor T3, and a source end of the transistor T4 is connected to the source terminal 31S of the switch 31. Moreover, a gate end of the transistor T4 is connected to the gate terminal 31G of the switch 31 with the resistor R4 interposed therebetween, and the drain end of the transistor T4 is connected to the source end of the transistor T4 with the resistor R8 interposed therebetween.

In such a circuit configuration, the switch 31 can switch connection and disconnection between the drain terminal 31D and the source terminal 31S based on the gate voltage $V_{G1}$ applied to the gate terminal 31G from the voltage control circuit 41.

Note that the number of transistors included in the switch 31 is not limited to four. For example, the switch 31 may include only three or less transistors, or may include five or more transistors. Moreover, the switch 31 may include one or more transistors connected between a ground and a path between the drain terminal 31D and the source terminal 31S.

1.4 Operation of Switches 31 to 36

Figure 3:
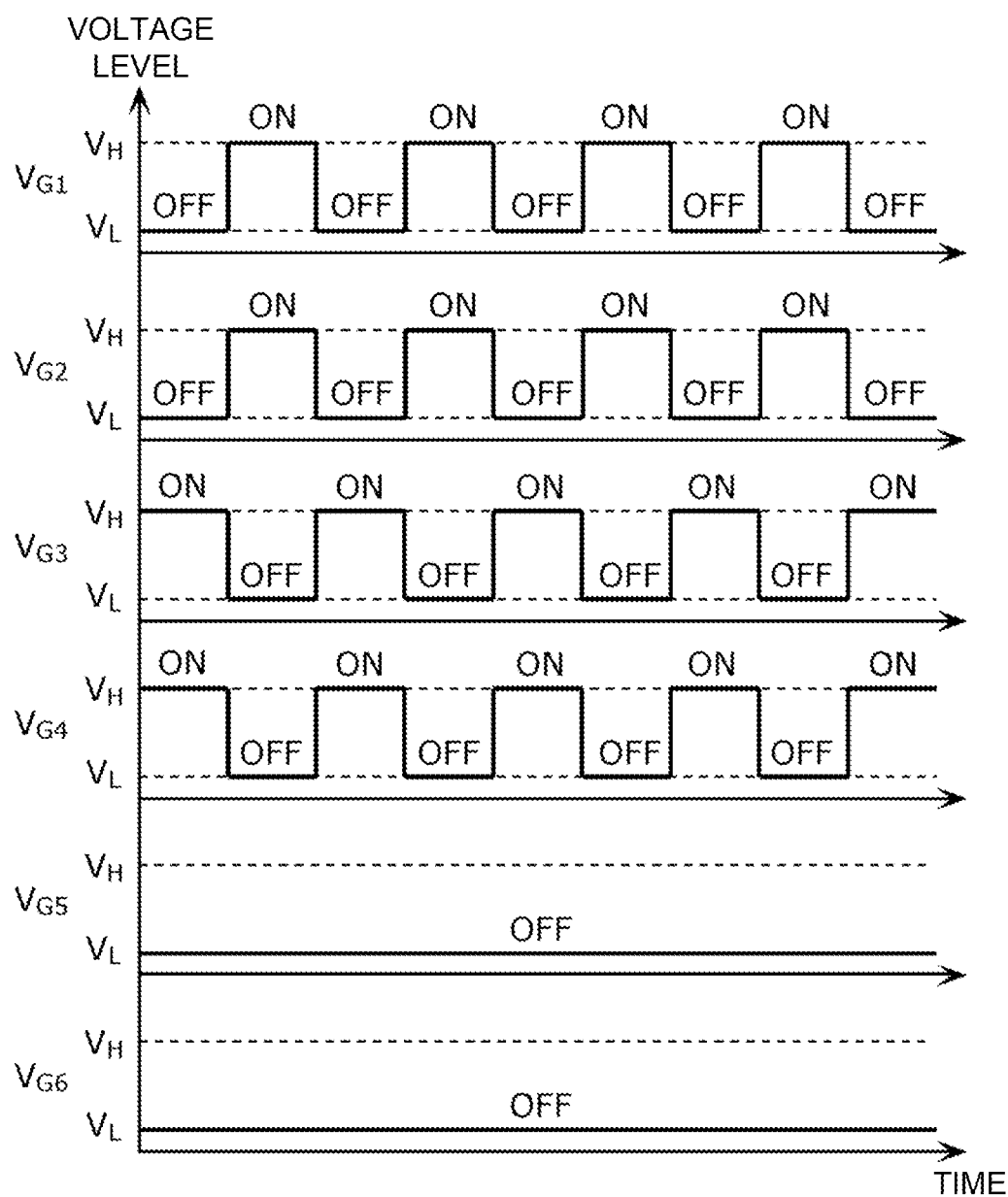
FIG. 3 is a graph illustrating gate voltage applied to the switch according to Embodiment 1 and open-and-close operation of the switch.

Next, one example of operation of the switches 31 to 36 are described with reference to FIG. 3. FIG. 3 is a graph illustrating the gate voltages $V_{G1}$ to $V_{G6}$ applied to the switches 31 to 36 according to this embodiment and open-and-close operation of the switches 31 to 36. In FIG. 3, a vertical axis indicates a voltage level, and a horizontal axis indicates time. $V_H$ and $V_L$ indicate a high level and a low level, respectively.

The gate voltage $V_{G1}$ which is applied to the gate terminal 31G of the switch 31 and the gate voltage $V_{G2}$ which is applied to the gate terminal 32G of the switch 32 are set to the same voltage level. That is, the voltage control circuit 41 applies, to the gate terminal 31G, the gate voltage $V_{G1}$ at the same level as the gate voltage $V_{G2}$, and the voltage control circuit 42 applies, to the gate terminal 32G, the gate voltage $V_{G2}$ at the same level as the gate voltage $V_{G1}$. Therefore, the switches 31 and 32 carry out the same open-and-close operation in synchronization with each other.

Similarly, the gate voltage $V_{G3}$ which is applied to the gate terminal 33G of the switch 33 and the gate voltage $V_{G4}$ which is applied to the gate terminal 34G of the switch 34 are set to the same voltage level. That is, the voltage control circuit 43 applies, to the gate terminal 33G, the gate voltage $V_{G3}$ at the same level as the gate voltage $V_{G4}$, and the voltage control circuit 44 applies, to the gate terminal 34G, the gate voltage $V_{G4}$ at the same level as the gate voltage $V_{G3}$. Therefore, the switches 33 and 34 carry out the same open-and-close operation in synchronization with each other.

On the other hand, the gate voltage $V_{G1}$ and the gate voltage $V_{G3}$ are set to the opposite voltage levels. That is, the voltage control circuit 41 applies, to the gate terminal 31G, the gate voltage $V_{G1}$ at the opposite level from the gate voltage $V_{G3}$, and the voltage control circuit 43 applies, to the gate terminal 33G, the gate voltage $V_{G3}$ at the opposite level from the gate voltage $V_{G1}$. Therefore, the switches 31 and 33 carry out the opposite open-and-close operation in synchronization with each other.

Similarly, the gate voltage $V_{G2}$ and the gate voltage $V_{G4}$ are set to the opposite voltage levels. That is, the voltage control circuit 42 applies, to the gate terminal 32G, the gate voltage $V_{G2}$ at the opposite level from the gate voltage $V_{G4}$, and the voltage control circuit 44 applies, to the gate terminal 34G, the gate voltage $V_{G4}$ at the opposite level from the gate voltage $V_{G2}$. Therefore, the switches 32 and 34 carry out the opposite open-and-close operation in synchronization with each other.

Note that although, in FIG. 3, the switches 35 and 36 are closed all the time, the operation of the switches 35 and 36 is not limited to such operation. For example, the operation of the switches 35 and 36 may be interchanged with the operation of the switches 33 and 34. That is, the switches 35 and 36 may carry out the open-and-close operation opposite from the operation of the switches 31 and 32 in synchronization with the switches 31 and 32.

1.5 Mounting Example of Switching Circuit 1

Figure 4:
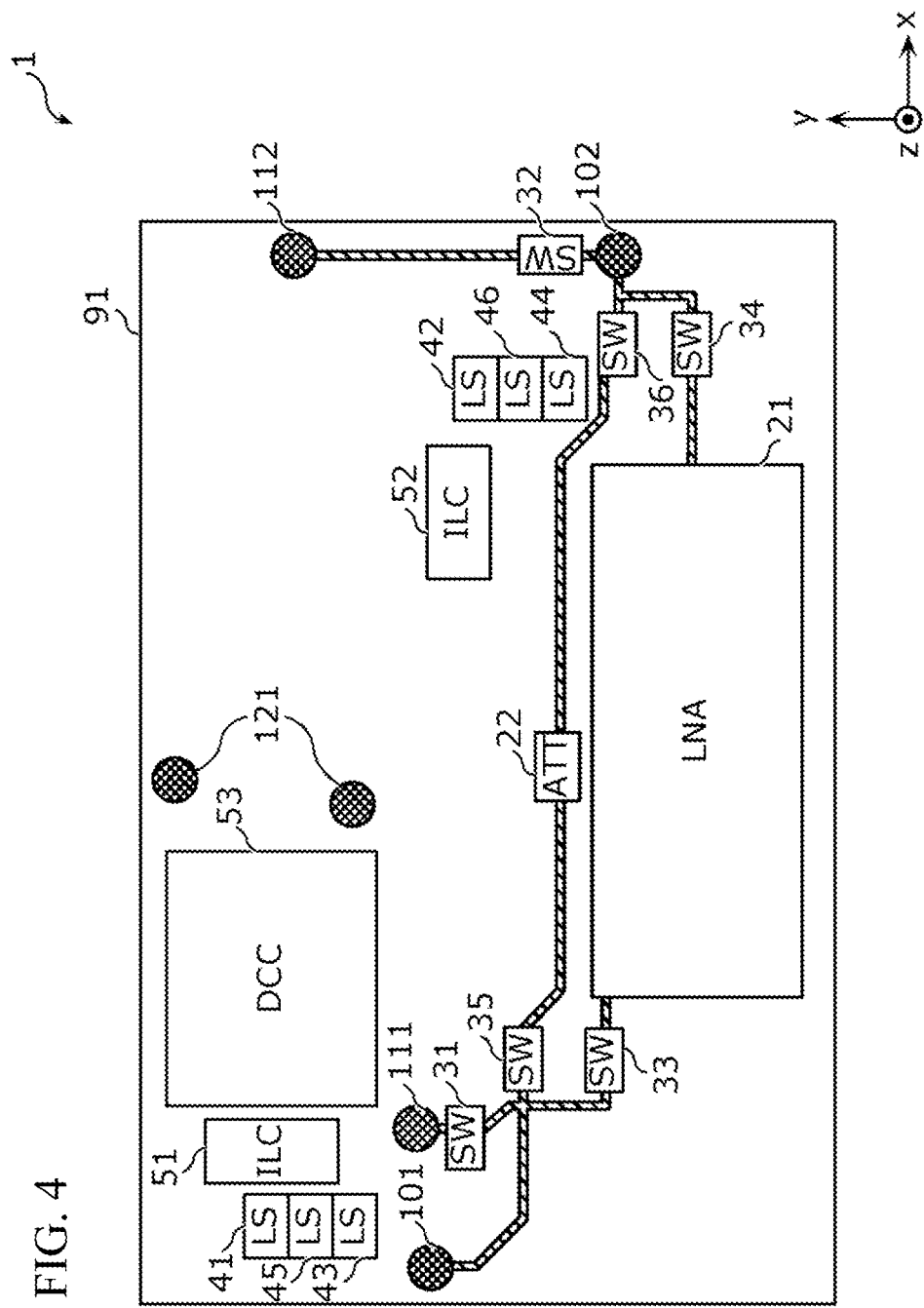
FIG. 4 is a plan view of a switching circuit according to Embodiment 1.

Next, a mounting example of the switching circuit 1 is described with reference to FIG. 4. FIG. 4 is a plan view of the switching circuit 1 according to this embodiment, and is a transparent view of the inside of a substrate 91. Note that, in FIG. 4, illustration of some of pieces of wiring and conductors provided on or inside the substrate 91 are omitted. Moreover, in FIG. 4, in order to make understanding of positional relation of each circuit component easier, an abbreviated name indicating the function of each circuit component (for example, "LNA") may be given. However, the abbreviated names are not necessarily given to the actual circuit components.

Note that FIG. 4 shows an example of the circuit configuration, and the switching circuit 1 may be implemented using any of great variety of circuit mountings and circuit techniques. Therefore, description of the switching circuit 1 given blow should not be interpreted as limitation.

As illustrated in FIG. 4, the switching circuit 1 is a semiconductor integrated circuit, and is mounted on the substrate 91. The substrate 91 is a semiconductor substrate, and may be referred to as a die or a chip. As semiconductor material, silicon monocrystal, gallium nitride (GaN), silicon carbide (SiC), or the like may be used.

The substrate 91 is provided with the low noise amplifier 21 (LNA), the attenuator 22 (ATT), the switches 31 to 36 (SW), the voltage control circuits 41 to 46 (LS), the input logic circuits 51 and 52 (ILC), and the digital control circuit 53 (DCC). Moreover, the substrate 91 is provided with, as external connection terminals, the input-and-output terminals 101 and 102, the PA connection terminals 111 and 112, and the controlling terminal 121.

The voltage control circuit 41 is disposed to be apart from the voltage control circuit 42. Distance between the voltage control circuit 41 and the switch 31 is shorter than distance between the voltage control circuit 41 and the switch 32. The voltage control circuit 41 is disposed in the vicinity of the switch 31.

The voltage control circuit 42 is disposed to be apart from the voltage control circuit 41. Distance between the voltage control circuit 42 and the switch 32 is shorter than distance between the voltage control circuit 42 and the switch 31. The voltage control circuit 42 is disposed in the vicinity of the switch 32.

The voltage control circuit 43 is disposed to be apart from the voltage control circuit 44. Distance between the voltage control circuit 43 and the switch 33 is shorter than distance between the voltage control circuit 43 and the switch 34. The voltage control circuit 43 is disposed in the vicinity of the switch 33.

The voltage control circuit 44 is disposed to be apart from the voltage control circuit 43. Distance between the voltage control circuit 44 and the switch 34 is shorter than distance between the voltage control circuit 44 and the switch 33. The voltage control circuit 44 is disposed in the vicinity of the switch 34.

The voltage control circuit 45 is disposed to be apart from the voltage control circuit 46. Distance between the voltage control circuit 45 and the switch 35 is shorter than distance between the voltage control circuit 45 and the switch 36. The voltage control circuit 45 is disposed in the vicinity of the switch 35.

The voltage control circuit 46 is disposed to be apart from the voltage control circuit 45. Distance between the voltage control circuit 46 and the switch 36 is shorter than distance between the voltage control circuit 46 and the switch 35. The voltage control circuit 46 is disposed in the vicinity of the switch 36.

The input logic circuit 51 is disposed to be apart from the input logic circuit 52. Distance between the input logic circuit 51 and the voltage control circuits 41, 43, and 45 is shorter than distance between the input logic circuit 51 and the voltage control circuits 42, 44, and 46. The input logic circuit 51 is disposed in the vicinity of the voltage control circuits 41, 43, and 45.

The input logic circuit 52 is disposed to be apart from the input logic circuit 51. Distance between the input logic circuit 52 and the voltage control circuits 42, 44, and 46 is shorter than distance between the input logic circuit 52 and the voltage control circuits 41, 43, and 45. The input logic circuit 52 is disposed in the vicinity of the voltage control circuits 42, 44, and 46.

1.6 Effect Etc.

As described above, the switching circuit 1 according to this embodiment includes the substrate 91 having the input-and-output terminals 101 and 102, the switch 31, the voltage control circuit 41, the switch 32, and the voltage control circuit 42. The switch 31 is provided to the substrate 91 and includes the source terminal 31S, the gate terminal 31G, and the drain terminal 31D. The source terminal 31S is connected to the input end of the power amplifier 11, and the drain terminal 31D is connected to the input-and-output terminal 101. The voltage control circuit 41 is provided to the substrate 91 and connected to the gate terminal 31G. The switch 32 is provided to the substrate 91 and includes the source terminal 32S, the gate terminal 32G, and the drain terminal 32D. The source terminal 32S is connected to the input-and-output terminal 102, and the drain terminal 32D is connected to the output end of the power amplifier 11. The voltage control circuit 42 is provided to the substrate 91 to be apart from the voltage control circuit 41, and connected to the gate terminal 32G.

In this configuration, the voltage control circuit 41 connected to the gate terminal 31G of the switch 31 and the voltage control circuit 42 connected to the gate terminal 32G of the switch 32 are provided to the substrate 91 such that the voltage control circuit 41 and the voltage control circuit 42 are apart from each other. Therefore, it can be suppressed that a high frequency signal which flows between the drain terminal 32D and the source terminal 32S of the switch 32 flows into the gate terminal 31G of the switch 31 via the voltage control circuit 42 which is connected to the gate terminal 32G. That is, isolation between the switches 31 and 32 (that is, between the input-and-output terminals 101 and 102) can be improved. As a result, isolation between the input end and the output end of the power amplifier 11 can be improved, and decrease in gain and a stability factor of the power amplifier 11 can be suppressed. Particularly, the switches 31 and 32 respectively connected to the input end and the output end of the power amplifier 11 are often controlled by a single voltage control circuit. Therefore, effect on improving isolation by separating the voltage control circuit for the switches 31 and 32 into the two voltage control circuits 41 and 42 is large.

Moreover, for example, in the switching circuit 1 according to this embodiment, the distance between the voltage control circuit 41 and the switch 31 may be shorter than the distance between the voltage control circuit 41 and the switch 32.

In this configuration, the voltage control circuit 41 can be disposed in the vicinity of the switch 31, and a length of control wiring connecting between the voltage control circuit 41 and the gate terminal 31G of the switch 31 can be shortened. Therefore, coupling between control wiring of the switch 31 and control wiring of the switch 32 can be suppressed, and it can be suppressed that a high frequency signal which flows into the control wiring of the switch 32 flows into the switch 31 via the control wiring of the switch 31. That is, isolation between the switches 31 and 32 can further be improved.

Moreover, for example, in the switching circuit 1 according to this embodiment, the distance between the voltage control circuit 42 and the switch 32 may be shorter than the distance between the voltage control circuit 42 and the switch 31.

In this configuration, the voltage control circuit 42 can be disposed in the vicinity of the switch 32, and a length of control wiring connecting between the voltage control circuit 42 and the gate terminal 32G of the switch 32 can be shortened. Therefore, coupling between the control wiring of the switch 31 and the control wiring of the switch 32 can be suppressed, and it can be suppressed that a high frequency signal which flows into the control wiring of the switch 32 flows into the switch 31 via the control wiring of the switch 31. That is, isolation between the switches 31 and 32 can further be improved.

Moreover, for example, in the switching circuit 1 according to this embodiment, the voltage control circuit 41 may apply, to the gate terminal 31G, the gate voltage $V_{G1}$, and the voltage control circuit 42 may apply, to the gate terminal 32G, the gate voltage $V_{G2}$ at the level same as the gate voltage $V_{G1}$ in synchronization with the gate voltage $V_{G1}$.

In this configuration, the voltage control circuit which synchronously applies the two gate voltages $V_{G1}$ and $V_{G2}$ at the same level are embodied by the two voltage control circuits 41 and 42. That is, the voltage control circuit which can be embodied by a single circuit is separated into the two voltage control circuits 41 and 42. Therefore, effect on improving isolation between the switches 31 and 32 is large.

Moreover, for example, the switching circuit 1 according to this embodiment may further include the input logic circuit 51 provided to the substrate 91 and connected to the voltage control circuit 41, and the input logic circuit 52 provided to the substrate 91 to be apart from the input logic circuit 51 and connected to the voltage control circuit 42.

In this configuration, the input logic circuits 51 and 52 respectively connected to the voltage control circuits 41 and 42 are also disposed to be apart from each other. Therefore, isolation between the switches 31 and 32 can further be improved.

Moreover, for example, the switching circuit 1 according to this embodiment may further include the low noise amplifier 21 provided to the substrate 91, the switch 33, the voltage control circuit 43, the switch 34, and the voltage control circuit 44. The switch 33 is provided to the substrate 91 and includes the source terminal 33S, the gate terminal 33G, and the drain terminal 33D. The source terminal 33S is connected to the input-and-output terminal 101, and the drain terminal 33D is connected to the output end of the low noise amplifier 21. The voltage control circuit 43 is provided to the substrate 91 and connected to the gate terminal 33G. The switch 34 is provided to the substrate 91 and includes the source terminal 34S, the gate terminal 34G, and the drain terminal 34D. The source terminal 34S is connected to the input end of the low noise amplifier 21, and the drain terminal 34D is connected to the input-and-output terminal 102. The voltage control circuit 44 is provided to the substrate 91 to be apart from the voltage control circuit 43, and connected to the gate terminal 34G.

In this configuration, the voltage control circuit 43 connected to the gate terminal 33G of the switch 33 and the voltage control circuit 44 connected to the gate terminal 34G of the switch 34 are provided to the substrate 91 such that the voltage control circuit 43 and the voltage control circuit 44 are apart from each other. Therefore, it can be suppressed that a high frequency signal which flows between the drain terminal 33D and the source terminal 33S of the switch 33 flows into the gate terminal 34G of the switch 34 via the voltage control circuit 43 which is connected to the gate terminal 33G. That is, isolation between the switches 33 and 34 (that is, between the input-and-output terminals 101 and 102) can be improved. As a result, isolation between the input end and the output end of the low noise amplifier 21 can be improved, and decrease in gain and a stability factor of the low noise amplifier 21 can be suppressed. Particularly, the switches 33 and 34 respectively connected to the input end and the output end of the low noise amplifier 21 are often controlled by a single voltage control circuit. Therefore, effect on improving isolation by separating the voltage control circuit for the switches 33 and 34 into the two voltage control circuits 43 and 44 is large.

Moreover, for example, in the switching circuit 1 according to this embodiment, the distance between the voltage control circuit 43 and the switch 33 may be shorter than the distance between the voltage control circuit 43 and the switch 34.

In this configuration, the voltage control circuit 43 can be disposed in the vicinity of the switch 33, and a length of control wiring connecting between the voltage control circuit 43 and the gate terminal 33G of the switch 33 can be shortened. Therefore, coupling between control wiring of the switch 33 and control wiring of the switch 34 can be suppressed, and it can be suppressed that a high frequency signal which flows in the control wiring of the switch 33 flows into the switch 34 via the control wiring of the switch 34. That is, isolation between the switches 33 and 34 can further be improved.

Moreover, for example, in the switching circuit 1 according to this embodiment, the distance between the voltage control circuit 44 and the switch 34 may be shorter than the distance between the voltage control circuit 44 and the switch 33.

In this configuration, the voltage control circuit 44 can be disposed in the vicinity of the switch 34, and a length of control wiring connecting between the voltage control circuit 44 and the gate terminal 34G of the switch 34 can be shortened. Therefore, coupling between the control wiring of the switch 33 and the control wiring of the switch 34 can be suppressed, and it can be suppressed that a high frequency signal which flows in the control wiring of the switch 33 flows into the switch 34 via the control wiring of the switch 34. That is, isolation between the switches 33 and 34 can further be improved.

Moreover, for example, in the switching circuit 1 according to this embodiment, the voltage control circuit 43 may apply, to the gate terminal 33G, the gate voltage $V_{G3}$, and the voltage control circuit 44 may apply, to the gate terminal 34G, the gate voltage $V_{G4}$ at the level same as the gate voltage $V_{G3}$ in synchronization with the gate voltage $V_{G3}$.

In this configuration, the voltage control circuit which synchronously applies the two gate voltages $V_{G3}$ and $V_{G4}$ at the same level are embodied by the two voltage control circuits 43 and 44. That is, the voltage control circuit which can be embodied by a single circuit is separated into the two voltage control circuits 43 and 44. Therefore, effect on improving isolation between the switches 33 and 34 is large.

Modification of Embodiment 1

Next, a modification of Embodiment 1 is described. This modification is different from Embodiment 1 mainly in that a low pass filter is connected between the voltage control circuit and the switch. This modification is described below with reference to FIG. 5 focusing on the different point from Embodiment 1.

1.7 Circuit Configuration of Switching Circuit 1A

Figure 5:
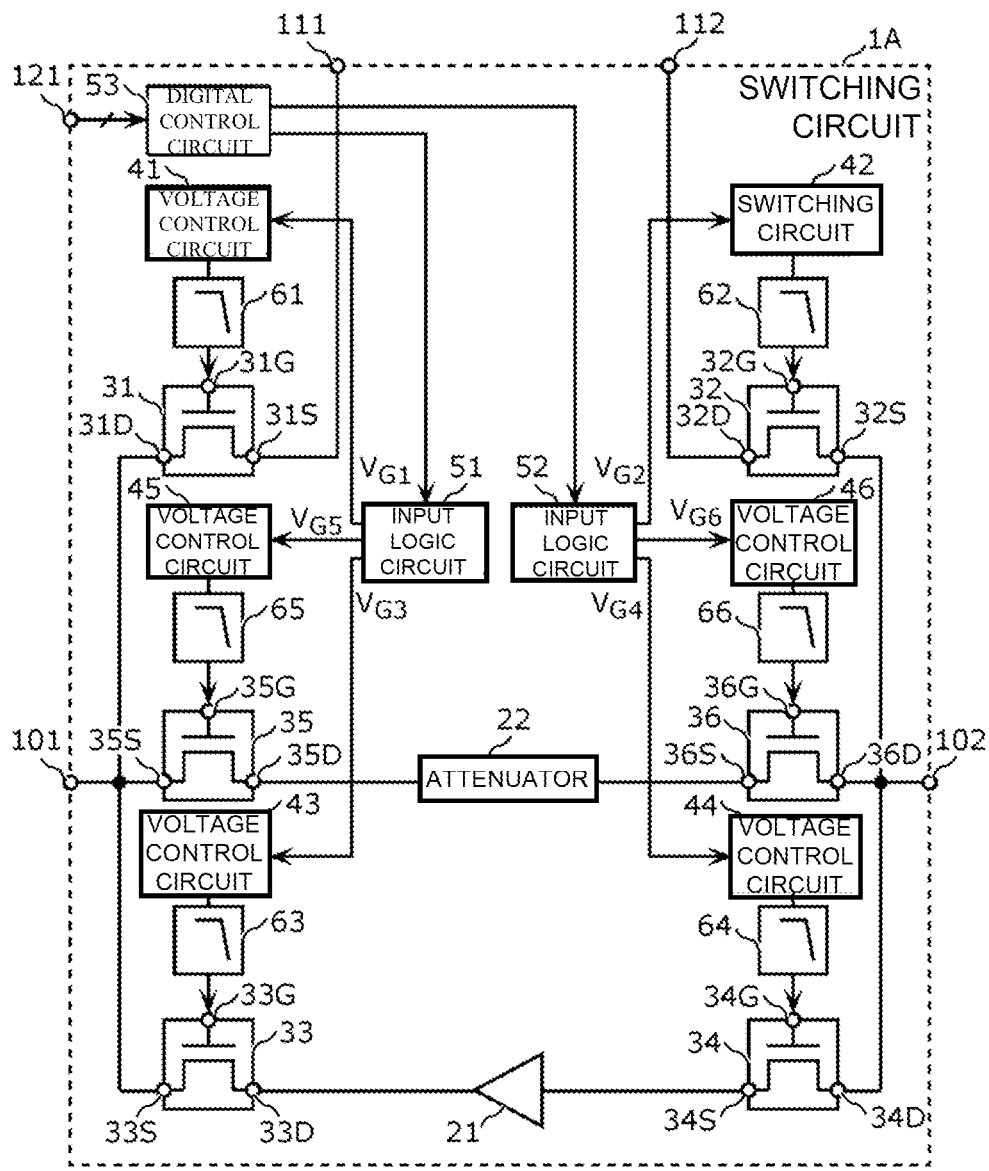
FIG. 5 is a circuit configuration diagram of a switching circuit according to a modification of Embodiment 1.

FIG. 5 is a circuit configuration diagram of a switching circuit 1A according to this modification. Note that FIG. 5 shows an example of the circuit configuration, and the switching circuit 1A may be implemented using any of great variety of circuit mountings and circuit techniques. Therefore, description of the switching circuit 1A given blow should not be interpreted as limitation.

The switching circuit 1A includes the low noise amplifier 21, the attenuator 22, the switches 31 to 36, the voltage control circuits 41 to 46, the input logic circuits 51 and 52, the digital control circuit 53, low pass filters 61 to 66, the input-and-output terminals 101 and 102, the PA connection terminals 111 and 112, and the controlling terminal 121.

The low pass filter 61 is connected between the voltage control circuit 41 and the gate terminal 31G of the switch 31. The low pass filter 62 is connected between the voltage control circuit 42 and the gate terminal 32G of the switch 32. The low pass filter 63 is connected between the voltage control circuit 43 and the gate terminal 33G of the switch 33. The low pass filter 64 is connected between the voltage control circuit 44 and the gate terminal 34G of the switch 34. The low pass filter 65 is connected between the voltage control circuit 45 and the gate terminal 35G of the switch 35. The low pass filter 66 is connected between the voltage control circuit 46 and the gate terminal 36G of the switch 36.

1.8 Effect Etc.

As described above, the switching circuit 1A according to this embodiment may further include the low pass filter 61 provided to the substrate 91 and connected between the voltage control circuit 41 and the gate terminal 31G, and the low pass filter 62 provided to the substrate 91 and connected between the voltage control circuit 42 and the gate terminal 32G.

In this configuration, the low pass filters 61 and 62 can attenuate high frequency signals which flow into the control wiring of the switch 31 and the control wiring of the switch 32. Therefore, isolation between the switches 31 and 32 can further be improved.

Moreover, for example, the switching circuit 1A according to this embodiment may further include the low pass filter 63 connected between the voltage control circuit 43 and the gate terminal 33G, and the low pass filter 64 connected between the voltage control circuit 44 and the gate terminal 34G.

In this configuration, the low pass filters 63 and 64 can attenuate high frequency signals which flow into the control wiring of the switch 33 and the control wiring of the switch 34. Therefore, isolation between the switches 33 and 34 can further be improved.

Embodiment 2

Next, Embodiment 2 is described. This embodiment is different from Embodiment 1 mainly in that the switching circuit is a switching circuit of an SPnT type. This embodiment is described below with reference to FIG. 6 to FIG. 8 focusing on the different point from Embodiment 1.

2.1 Circuit Configuration of Switching Circuit 1B

Figure 6:
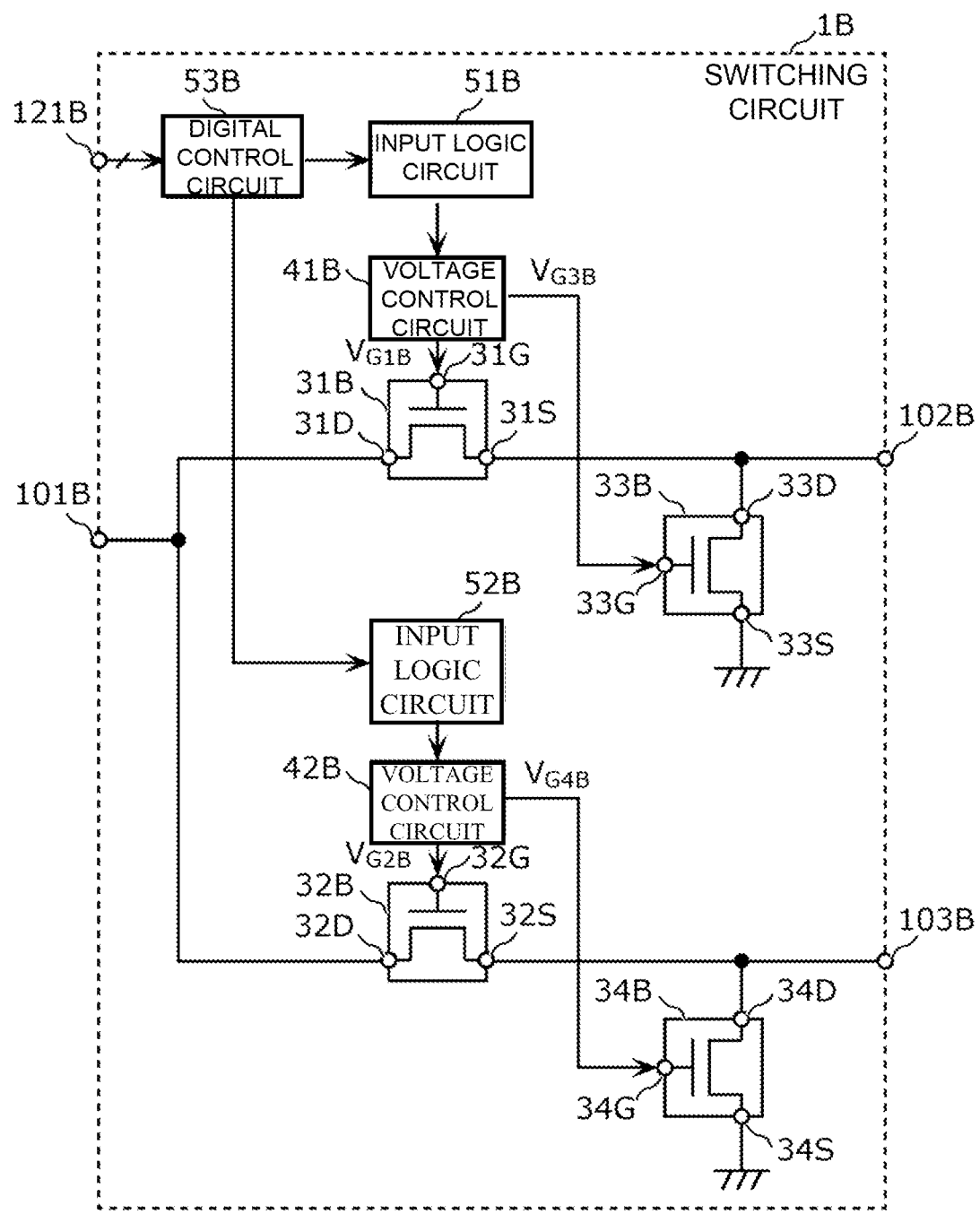
FIG. 6 is a circuit configuration diagram of a switching circuit according to Embodiment 2.

First, a circuit configuration of a switching circuit 1B is described with reference to FIG. 6. FIG. 6 is a circuit configuration diagram of the switching circuit 1B according to this embodiment. Note that FIG. 6 shows an example of the circuit configuration, and the switching circuit 1B may be implemented using any of great variety of circuit mountings and circuit techniques. Therefore, description of the switching circuit 1B given blow should not be interpreted as limitation.

The switching circuit 1B according to this embodiment is a switching circuit of a single-pole double-throw (SPDT) type. The switching circuit 1B includes switches 31B to 34B, voltage control circuits 41B and 42B, input logic circuits 51B and 52B, a digital control circuit 53B, a common terminal 101B, selection terminals 102B and 103B, and a controlling terminal 121B.

The common terminal 101B, the selection terminals 102B and 103B, and the controlling terminal 121B are external connection terminals of the switching circuit 1B. For example, each of the common terminal 101B and the selection terminals 102B and 103B may be used as an input terminal which receives a high frequency signal from the outside and/or an output terminal which supplies a high frequency signal to the outside. Moreover, for example, the controlling terminal 121B may be used as a terminal which receives a digital control signal from the outside.

The switch 31B is one example of the first switch, and is connected between the common terminal 101B and the selection terminal 102B. Specifically, the switch 31B includes the source terminal 31S, the gate terminal 31G, and the drain terminal 31D. The source terminal 31S is one example of the first source terminal, and is connected to the selection terminal 102B. The gate terminal 31G is one example of the first gate terminal, and is connected to the voltage control circuit 41B. The drain terminal 31D is one example of the first drain terminal, and is connected to the common terminal 101B.

In this configuration, the switch 31B can switch connection and disconnection between the source terminal 31S and the drain terminal 31D based on a gate voltage $V_{G1B}$ supplied from the voltage control circuit 41B.

The switch 32B is one example of the second switch, and is connected between the common terminal 101B and the selection terminal 103B. Specifically, the switch 32B includes the source terminal 32S, the gate terminal 32G, and the drain terminal 32D. The source terminal 32S is one example of the second source terminal, and is connected to the selection terminal 103B. The gate terminal 32G is one example of the second gate terminal, and is connected to the voltage control circuit 42B. The drain terminal 32D is one example of the second drain terminal, and is connected to the common terminal 101B.

In this configuration, the switch 32B can switch connection and disconnection between the source terminal 32S and the drain terminal 32D based on a gate voltage $V_{G2B}$ supplied from the voltage control circuit 42B.

The switch 33B is one example of the third switch, and is connected between the common terminal 101B and the selection terminal 102B. Specifically, the switch 33B includes the source terminal 33S, the gate terminal 33G, and the drain terminal 33D. The source terminal 33S is one example of the third source terminal, and is connected to the ground. The gate terminal 33G is one example of the third gate terminal, and is connected to the voltage control circuit 41B. The drain terminal 33D is one example of the third drain terminal, and is connected to a path between the source terminal 31S of the switch 31B and the selection terminal 102B.

In this configuration, the switch 33B can switch connection and disconnection between the source terminal 33S and the drain terminal 33D based on a gate voltage $V_{G3B}$ supplied from the voltage control circuit 41B.

The switch 34B is one example of the fourth switch, and is connected between the common terminal 101B and the selection terminal 103B. Specifically, the switch 34B includes the source terminal 34S, the gate terminal 34G, and the drain terminal 34D. The source terminal 34S is one example of the fourth source terminal, and is connected to the ground. The gate terminal 34G is one example of the fourth gate terminal, and is connected to the voltage control circuit 42B. The drain terminal 34D is one example of the fourth drain terminal, and is connected to a path between the source terminal 32S of the switch 32B and the selection terminal 103B.

In this configuration, the switch 34B can switch connection and disconnection between the source terminal 34S and the drain terminal 34D based on a gate voltage $V_{G4B}$ supplied from the voltage control circuit 42B.

Note that since the switches 31B to 34B have circuit configurations similar to the switch 31 according to Embodiment 1, illustration and description thereof are omitted.

The voltage control circuit 41B is one example of the first voltage control circuit, and is connected to the input logic circuit 51B and the gate terminals 31G and 33G. The voltage control circuit 41B can apply the gate voltage $V_{G1B}$ to the gate terminal 31G and the gate voltage $V_{G3B}$ to the gate terminal 33G based on an output signal of the input logic circuit 51B.

The voltage control circuit 42B is one example of the second voltage control circuit, and is connected to the input logic circuit 52B and the gate terminals 32G and 34G. The voltage control circuit 42B can apply the gate voltage $V_{G2B}$ to the gate terminal 32G and the gate voltage $V_{G4B}$ to the gate terminal 34G based on an output signal of the input logic circuit 52B.

The input logic circuit 51B is connected to the voltage control circuit 41B. The input logic circuit 51B can output a control signal to the voltage control circuit 41B based on an output signal of the digital control circuit 53B. That is, the input logic circuit 51B can generate the control signal for the voltage control circuit 41B by processing the control signal for the input logic circuit 51B outputted from the digital control circuit 53B.

The input logic circuit 52B is connected to the voltage control circuit 42B. The input logic circuit 52B can output a control signal to the voltage control circuit 42B based on an output signal of the digital control circuit 53B. That is, the input logic circuit 52B can generate the control signal for the voltage control circuit 42B by processing the control signal for the input logic circuit 52B outputted from the digital control circuit 53B.

Note that the input logic circuits 51B and 52B may be embodied by a single input logic circuit. For example, a single input logic circuit may be connected to the voltage control circuits 41B and 42B, and may output control signals to the voltage control circuits 41B and 42B.

The digital control circuit 53B is connected to the input logic circuits 51B and 52B. The digital control circuit 53B can transmit control signals to the input logic circuits 51B and 52B based on a digital control signal received via the controlling terminal 121B. That is, the digital control circuit 53B can generate the control signals for the input logic circuits 51B and 52B by processing the digital control signal. As the digital control signal, a source-synchronous digital control signal may be used. Note that the digital control signal is not limited to the source-synchronous control signal. For example, a clock-embedded control signal may be used as the digital control signal.

2.2 Operation of Switches 31B to 34B

Figure 7:
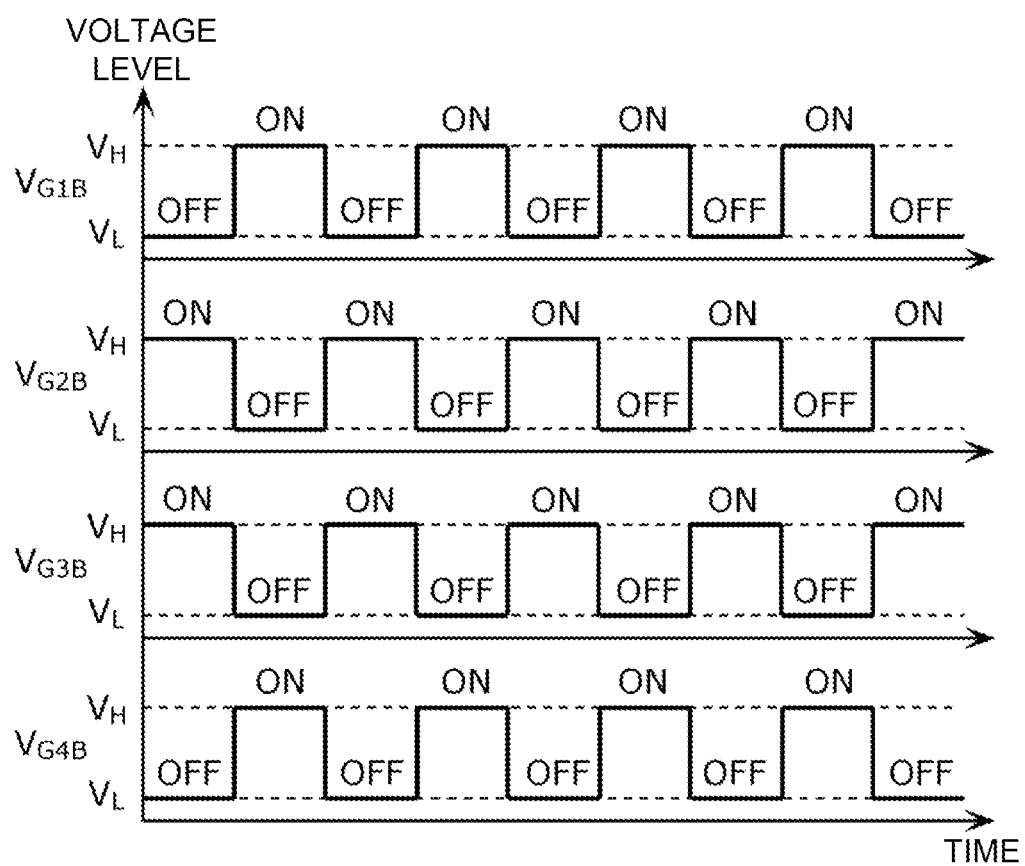
FIG. 7 is a graph illustrating gate voltage applied to a switch according to Embodiment 2 and open-and-close operation of the switch.

Next, one example of operation of the switches 31B to 34B are described with reference to FIG. 7. FIG. 7 is a graph illustrating the gate voltages $V_{G1B}$ to $V_{G4B}$ applied to the switches 31B to 34B according to this embodiment and open-and-close operation of the switches 31B to 34B. In FIG. 7, a vertical axis indicates a voltage level, and a horizontal axis indicates time.

The gate voltage $V_{G1B}$ which is applied to the gate terminal 31G of the switch 31B and the gate voltage $V_{G2B}$ which is applied to the gate terminal 32G of the switch 32B are set to voltage levels opposite from each other. That is, the voltage control circuit 41B applies, to the gate terminal 31G, the gate voltage $V_{G1B}$ at the opposite level from the gate voltage $V_{G2B}$, and the voltage control circuit 42B applies, to the gate terminal 32G, the gate voltage $V_{G2B}$ at the opposite level from the gate voltage $V_{G1B}$. Therefore, the switches 31B and 32B carry out the opposite open-and-close operation in synchronization with each other.

Moreover, the gate voltage $V_{G1B}$ which is applied to the gate terminal 31G of the switch 31B and the gate voltage $V_{G3B}$ which is applied to the gate terminal 33G of the switch 33B are set to voltage levels opposite from each other. That is, the voltage control circuit 41B applies, to the gate terminals 31G and 33G, the gate voltages $V_{G1B}$ and $V_{G3B}$ at the opposite voltage levels from each other, respectively. Therefore, the switches 31B and 33B carry out the opposite open-and-close operation in synchronization with each other.

Similarly, the gate voltage $V_{G2B}$ which is applied to the gate terminal 32G of the switch 32B and the gate voltage $V_{G4B}$ which is applied to the gate terminal 34G of the switch 34B are set to voltage levels opposite from each other. That is, the voltage control circuit 42B applies, to the gate terminals 32G and 34G, the gate voltages $V_{G2B}$ and $V_{G4B}$ at the opposite voltage levels from each other, respectively.

Therefore, the switches 32B and 34B carry out the opposite open-and-close operation in synchronization with each other.

2.3 Mounting Example of Switching Circuit 1B

Figure 8:
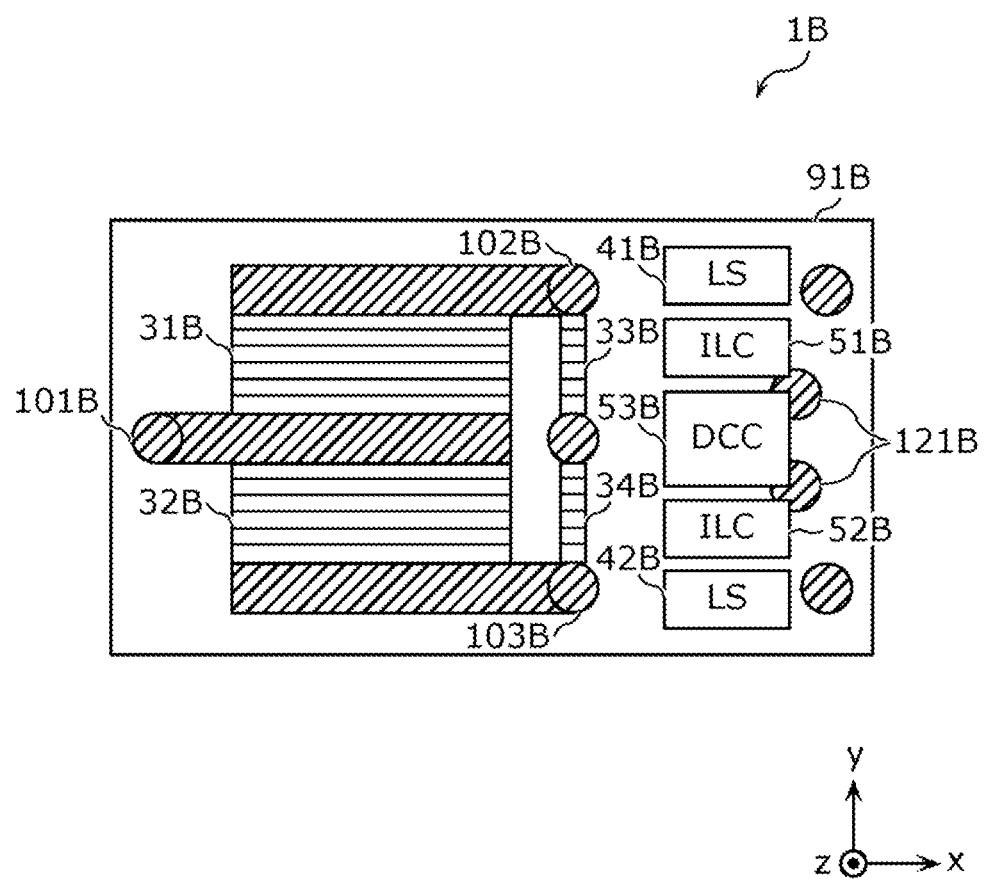
FIG. 8 is a plan view of a switching circuit according to Embodiment 2.

Next, a mounting example of the switching circuit 1B is described with reference to FIG. 8. FIG. 8 is a plan view of the switching circuit 1B according to this embodiment, and is a transparent view of the inside of a substrate 91B. Note that FIG. 8 illustrates only some of pieces of wiring and conductors provided on or inside the substrate 91B. Moreover, in FIG. 8, in order to make understanding of positional relation of each circuit component easier, an abbreviated name indicating the function of each circuit component (for example, "LNA") may be given. However, the abbreviated names are not necessarily given to the actual circuit components.

Note that FIG. 8 shows an example of the circuit configuration, and the switching circuit 1B may be implemented using any of great variety of circuit mountings and circuit techniques. Therefore, description of the switching circuit 1B given blow should not be interpreted as limitation.

As illustrated in FIG. 8, the switching circuit 1B is mounted on the substrate 91B. The substrate 91B is a semiconductor substrate, and may be referred to as a die or a chip. As semiconductor material, similarly to the substrate 91 according to Embodiment 1, silicon monocrystal, gallium nitride (GaN), silicon carbide (SiC), or the like may be used.

The substrate 91B is provided with the switches 31B to 34B, the voltage control circuits 41B and 42B (LS), the input logic circuits 51B and 52B (ILC), and the digital control circuit 53B (DCC). Moreover, the substrate 91B is provided with, as external connection terminals, the common terminal 101B, the selection terminals 102B and 103B, the controlling terminal 121B, and a ground terminal.

The voltage control circuit 41B is disposed to be apart from the voltage control circuit 42B. Distance between the voltage control circuit 41B and the switch 31B is shorter than distance between the voltage control circuit 41B and the switch 32B. The voltage control circuit 41B is disposed in the vicinity of the switch 31B.

The voltage control circuit 42B is disposed to be apart from the voltage control circuit 41B. Distance between the voltage control circuit 42B and the switch 32B is shorter than distance between the voltage control circuit 42B and the switch 31B. The voltage control circuit 42B is disposed in the vicinity of the switch 32B.

The input logic circuit 51B is disposed to be apart from the input logic circuit 52B. Distance between the input logic circuit 51B and the voltage control circuit 41B is shorter than distance between the input logic circuit 51B and the voltage control circuit 42B. The input logic circuit 51B is disposed in the vicinity of the voltage control circuit 41B.

The input logic circuit 52B is disposed to be apart from the input logic circuit 51B. Distance between the input logic circuit 52B and the voltage control circuit 42B is shorter than distance between the input logic circuit 52B and the voltage control circuit 41B. The input logic circuit 52B is disposed in the vicinity of the voltage control circuit 42B.

Note that the switching circuit 1B is not limited to be an SPDT-type switching circuit. For example, the switching circuit 1B may be an SP3T-type, an SP4T-type, or an SP5T-type switching circuit. That is, the switching circuit 1B is an SPnT-type switching circuit. Moreover, the switching circuit 1B may include a plurality of SPnT-type switching circuits. That is, the switching circuit 1B may be an nPnT-type switching circuit.

2.4 Effect Etc.

As described above, the switching circuit 1B according to this embodiment is a switching circuit of an SPnT type, and includes the substrate 91B, the switch 31B, the voltage control circuit 41B, the switch 32B, and the voltage control circuit 42B. The substrate 91B includes the common terminal 101B and the selection terminals 102B and 103B. The switch 31B is provided to the substrate 91B and includes the source terminal 31S, the gate terminal 31G, and the drain terminal 31D. The drain terminal 31D is connected to the common terminal 101B, and the source terminal 31S is connected to the selection terminal 102B. The voltage control circuit 41B is provided to the substrate 91B and connected to the gate terminal 31G. The switch 32B is provided to the substrate 91B and includes the source terminal 32S, the gate terminal 32G, and the drain terminal 32D. The drain terminal 32D is connected to the common terminal 101B, and the source terminal 32S is connected to the selection terminal 103B. The voltage control circuit 42B is provided to the substrate 91B to be apart from the voltage control circuit 41B, and connected to the gate terminal 32G.

In this configuration, the voltage control circuit 41B connected to the gate terminal 31G of the switch 31B and the voltage control circuit 42B connected to the gate terminal 32G of the switch 32B are provided to the substrate 91B such that the voltage control circuit 41B and the voltage control circuit 42B are apart from each other. Therefore, it can be suppressed that a high frequency signal which flows between the drain terminal 31D and the source terminal 31S of the switch 31B flows into the gate terminal 32G of the switch 32B via the voltage control circuit 41B which is connected to the gate terminal 31G. Conversely, it can also be suppressed that a high frequency signal which flows between the drain terminal 32D and the source terminal 32S of the switch 32B flows into the gate terminal 31G of the switch 31B via the voltage control circuit 42B which is connected to the gate terminal 32G. That is, isolation between the switches 31B and 32B can be improved. As a result, isolation between the selection terminals 102B and 103B can be improved. Particularly, the switches 31B and 32B which are series switches each connected to the selection terminals 102B and 103B of the SPnT-type switching circuit are often controlled by a single voltage control circuit. Therefore, effect on improving isolation by separating the voltage control circuit for the switches 31B and 32B into the two voltage control circuits 41B and 42B is large.

Moreover, for example, in the switching circuit 1B according to this embodiment, the distance between the voltage control circuit 41B and the switch 31B may be shorter than the distance between the voltage control circuit 41B and the switch 32B.

In this configuration, the voltage control circuit 41B can be disposed in the vicinity of the switch 31B, and a length of control wiring connecting between the voltage control circuit 41B and the gate terminal 31G of the switch 31B can be shortened. Therefore, coupling between control wiring of the switch 31B and control wiring of the switch 32B can be suppressed, and isolation between the switches 31B and 32B can further be improved.

Moreover, for example, in the switching circuit 1B according to this embodiment, the distance between the voltage control circuit 42B and the switch 32B may be shorter than the distance between the voltage control circuit 42B and the switch 31B.

In this configuration, the voltage control circuit 42B can be disposed in the vicinity of the switch 32B, and a length of control wiring connecting between the voltage control circuit 42B and the gate terminal 32G of the switch 32B can be shortened. Therefore, coupling between the control wiring of the switch 31B and the control wiring of the switch 32B can be suppressed, and isolation between the switches 31B and 32B can further be improved.

Moreover, for example, in the switching circuit 1B according to this embodiment, the voltage control circuit 41B may apply, to the gate terminal 31G, the gate voltage $V_{G1B}$, and the voltage control circuit 42B may apply, to the gate terminal 32G, the gate voltage $V_{G2B}$ at the level opposite from the gate voltage $V_{G1B}$ in synchronization with the gate voltage $V_{G1B}$.

In this configuration, the voltage control circuit which synchronously applies the two gate voltages $V_{G1B}$ and $V_{G2B}$ at the opposite levels are embodied by the two voltage control circuits 41B and 42B. That is, the voltage control circuit which can be embodied by a single circuit is separated into the two voltage control circuits 41B and 42B. Therefore, effect on improving isolation between the switches 31B and 32B is large.

Moreover, for example, the switching circuit 1B according to this embodiment may further include the switch 33B and the switch 34B. The switch 33B is provided to the substrate 91B and includes the source terminal 33S, the gate terminal 33G, and the drain terminal 33D. The drain terminal 33D is connected to the path between the source terminal 31S and the selection terminal 102B, and the source terminal 33S is connected to the ground. The switch 34B is provided to the substrate 91B and includes the source terminal 34S, the gate terminal 34G, and the drain terminal 34D. The drain terminal 34D is connected to the path between the source terminal 32S and the selection terminal 103B, and the source terminal 34S is connected to the ground. The voltage control circuit 41B may further be connected to the gate terminal 33G, and the voltage control circuit 42B may further be connected to the gate terminal 34G.

In this configuration, the voltage control circuit 41B connected to the gate terminal 33G of the switch 33B and the voltage control circuit 42B connected to the gate terminal 34G of the switch 34B are provided to the substrate 91B such that the voltage control circuit 41B and the voltage control circuit 42B are apart from each other. Therefore, isolation between the switches 33B and 34B can be improved, and isolation between the selection terminals 102B and 103B can be improved. Particularly, the switches 33B and 34B which are shunt switches each connected to the selection terminals 102B and 103B of the SPnT-type switching circuit are often controlled by a single voltage control circuit. Therefore, effect on improving isolation by separating the voltage control circuit for the switches 33B and 34B into the two voltage control circuits 41B and 42B is large.

Moreover, for example, in the switching circuit 1B according to this embodiment, the distance between the voltage control circuit 41B and the switch 33B may be shorter than the distance between the voltage control circuit 41B and the switch 34B.

In this configuration, the voltage control circuit 41B can be disposed in the vicinity of the switch 33B, and a length of control wiring connecting between the voltage control circuit 41B and the gate terminal 33G of the switch 33B can be shortened. Therefore, coupling between control wiring of the switch 33B and control wiring of the switch 34B can be suppressed, and isolation between the switches 33B and 34B can further be improved.

Moreover, for example, in the switching circuit 1B according to this embodiment, the distance between the voltage control circuit 42B and the switch 34B may be shorter than the distance between the voltage control circuit 42B and the switch 33B.

In this configuration, the voltage control circuit 42B can be disposed in the vicinity of the switch 34B, and a length of control wiring connecting between the voltage control circuit 42B and the gate terminal 34G of the switch 34B can be shortened. Therefore, coupling between the control wiring of the switch 33B and the control wiring of the switch 34B can be suppressed, and isolation between the switches 33B and 34B can further be improved.

Moreover, for example, in the switching circuit 1B according to this embodiment, the voltage control circuit 41B may apply, to the gate terminal 31G, the gate voltage $V_{G1B}$, and apply, to the gate terminal 33G, the gate voltage $V_{G3B}$ at the level opposite from the gate voltage $V_{G1B}$ in synchronization with the gate voltage $V_{G1B}$, and the voltage control circuit 42B may apply, to the gate terminal 32G, the gate voltage $V_{G2B}$ at the level opposite from the gate voltage $V_{G1B}$ in synchronization with the gate voltage $V_{G1B}$, and apply, to the gate terminal 34G, the gate voltage $V_{G4B}$ at the level opposite from the gate voltage $V_{G2B}$ in synchronization with the gate voltage $V_{G2B}$.

In this configuration, the voltage control circuit which synchronously applies the four gate voltages $V_{G1B}$, $V_{G2B}$, $V_{G3B}$, and $V_{G4B}$ at the same or opposite levels are embodied by the two voltage control circuits 41B and 42B. That is, the voltage control circuit which can be embodied by a single circuit is separated into the two voltage control circuits 41B and 42B. Therefore, effect on improving isolation between the switches 31B and 33B and the switches 32B and 34B is large.

Other Embodiments

The switching circuit according to the present disclosure is described above based on the embodiments and the modification thereof. However, the switching circuit according to the present disclosure is not limited to the embodiments and the modification described above. The present disclosure also includes another embodiment embodied by combining optional components in the embodiments and the modification described above, a modification obtained by applying, to the embodiments and the modification, various changes which are conceived by a person skilled in the art within the scope not departing from the gist of the present disclosure, and various devices having the switching circuit built therein.

For example, in the circuit configuration of the switching circuit according to each of the embodiments described above, another circuit element, wiring, or the like may be inserted on a path connecting each circuit element and signal path disclosed in the drawings. For example, in the switching circuit 1 according to Embodiment 1, a switch may be inserted between the ground and the path between the switch 31 and the PA connection terminal 111, and a switch may be inserted between the ground and the path between the switch 32 and the PA connection terminal 112.

Moreover, for example, Embodiment 2 and the modification of Embodiment 1 may be combined. Specifically, in the switching circuit 1B according to Embodiment 2, a low pass filter may be inserted between the voltage control circuit 41B and the switch 31B, and a low pass filter may be inserted between the voltage control circuit 42B and the switch 32B. Moreover, a low pass filter may be inserted between the voltage control circuit 41B and the switch 33B, and a low pass filter may be inserted between the voltage control circuit 42B and the switch 34B.

Moreover, although the switching circuit is mounted on a single semiconductor integrated circuit in each embodiment described above, it may dividedly be mounted on a plurality of semiconductor integrated circuits.

Features of the switching circuit described based on the above embodiments are described below.

<1> A switching circuit including:
 a substrate including a first input-and-output terminal and a second input-and-output terminal;
 a first switch provided to the substrate and including a first source terminal, a first gate terminal, and a first drain terminal, the first source terminal being connected to an input end of a power amplifier, the first drain terminal being connected to the first input-and-output terminal;
 a first voltage control circuit provided to the substrate and connected to the first gate terminal;
 a second switch provided to the substrate and including a second source terminal, a second gate terminal, and a second drain terminal, the second source terminal being connected to the second input-and-output terminal, the second drain terminal being connected to an output end of the power amplifier; and
 a second voltage control circuit provided to the substrate to be apart from the first voltage control circuit and connected to the second gate terminal.

<2> The switching circuit according to <1>, in which distance between the first voltage control circuit and the first switch is shorter than distance between the first voltage control circuit and the second switch.

<3> The switching circuit according to <1> or <2>, in which distance between the second voltage control circuit and the second switch is shorter than distance between the second voltage control circuit and the first switch.

<4> The switching circuit according to any one of <1> to <3>, in which
 the first voltage control circuit applies, to the first gate terminal, a first gate voltage, and
 the second voltage control circuit applies, to the second gate terminal, a second gate voltage at a level same as the first gate voltage in synchronization with the first gate voltage.

<5> The switching circuit according to any one of <1> to <4>, further including:
 a first low pass filter provided to the substrate and connected between the first voltage control circuit and the first gate terminal; and
 a second low pass filter provided to the substrate and connected between the second voltage control circuit and the second gate terminal.

<6> The switching circuit according to any one of <1> to <5>, further including:
 a first input logic circuit provided to the substrate and connected to the first voltage control circuit; and
 a second input logic circuit provided to the substrate to be apart from the first input logic circuit and connected to the second voltage control circuit.

<7> The switching circuit according to any one of <1> to <6>, further including:
 a low noise amplifier provided to the substrate;
 a third switch provided to the substrate and including a third source terminal, a third gate terminal, and a third drain terminal, the third source terminal being connected to the first input-and-output terminal, the third drain terminal being connected to an output end of the low noise amplifier;

a third voltage control circuit provided to the substrate and connected to the third gate terminal;

a fourth switch provided to the substrate and including a fourth source terminal, a fourth gate terminal, and a fourth drain terminal, the fourth source terminal being connected to an input end of the low noise amplifier, the fourth drain terminal being connected to the second input-and-output terminal; and a fourth voltage control circuit provided to the substrate to be apart from the third voltage control circuit and connected to the fourth gate terminal.

<8> The switching circuit according to <7>, in which distance between the third voltage control circuit and the third switch is shorter than distance between the third voltage control circuit and the fourth switch.

<9> The switching circuit according to <7> or <8>, in which distance between the fourth voltage control circuit and the fourth switch is shorter than distance between the fourth voltage control circuit and the third switch.

<10> The switching circuit according to any one of <7> to <9>, in which the third voltage control circuit applies, to the third gate terminal, a third gate voltage, and the fourth voltage control circuit applies, to the fourth gate terminal, a fourth gate voltage at a level same as the third gate voltage in synchronization with the third gate voltage.

<11> The switching circuit according to any one of <7> to <10>, further including:

a third low pass filter connected between the third voltage control circuit and the third gate terminal; and a fourth low pass filter connected between the fourth voltage control circuit and the fourth gate terminal.

<12> A switching circuit of an SPnT type, the switching circuit including:

a substrate including a common terminal, a first selection terminal, and a second selection terminal;

a first switch provided to the substrate and including a first source terminal, a first gate terminal, and a first drain terminal, the first drain terminal being connected to the common terminal, the first source terminal being connected to the first selection terminal;

a first voltage control circuit provided to the substrate and connected to the first gate terminal;

a second switch provided to the substrate and including a second source terminal, a second gate terminal, and a second drain terminal, the second drain terminal being connected to the common terminal, the second source terminal being connected to the second selection terminal; and a second voltage control circuit provided to the substrate to be apart from the first voltage control circuit and connected to the second gate terminal.

<13> The switching circuit according to <12>, in which distance between the first voltage control circuit and the first switch is shorter than distance between the first voltage control circuit and the second switch.

<14> The switching circuit according to <12> or <13>, in which distance between the second voltage control circuit and the second switch is shorter than distance between the second voltage control circuit and the first switch.

<15> The switching circuit according to any one of <12> to <14>, in which the first voltage control circuit applies, to the first gate terminal, a first gate voltage, and the second voltage control circuit applies, to the second gate terminal, a second gate voltage at a level opposite from the first gate voltage in synchronization with the first gate voltage.

<16> The switching circuit according to any one of <12> to <15>, further including:

a third switch provided to the substrate and including a third source terminal, a third gate terminal, and a third drain terminal, the third drain terminal being connected to a path between the first source terminal and the first selection terminal, the third source terminal being connected to a ground; and a fourth switch provided to the substrate and including a fourth source terminal, a fourth gate terminal, and a fourth drain terminal, the fourth drain terminal being connected to a path between the second source terminal and the second selection terminal, the fourth source terminal being connected to the ground, in which the first voltage control circuit is further connected to the third gate terminal, and the second voltage control circuit is further connected to the fourth gate terminal.

<17> The switching circuit according to <16>, in which distance between the first voltage control circuit and the third switch is shorter than distance between the first voltage control circuit and the fourth switch.

<18> The switching circuit according to <16> or <17>, in which distance between the second voltage control circuit and the fourth switch is shorter than distance between the second voltage control circuit and the third switch.

<19> The switching circuit according to any one of <16> to <18>, in which the first voltage control circuit applies, to the first gate terminal, a first gate voltage, and applies, to the third gate terminal, a third gate voltage at a level opposite from the first gate voltage in synchronization with the first gate voltage, and the second voltage control circuit applies, to the second gate terminal, a second gate voltage at a level opposite from the first gate voltage in synchronization with the first gate voltage, and applies, to the fourth gate terminal, a fourth gate voltage at a level opposite from the second gate voltage in synchronization with the second gate voltage.

The present disclosure can widely be utilized in communication devices, such as cellular phones, as switching circuits provided to front end portions.

What is claimed is:
1. A switching circuit comprising:
a substrate comprising a first input-and-output terminal and a second input-and-output terminal;
a first switch provided to the substrate and comprising a first source terminal, a first gate terminal, and a first drain terminal, the first source terminal being connected to an input of a power amplifier, and the first drain terminal being connected to the first input-and-output terminal;
a first voltage control circuit provided to the substrate and connected to the first gate terminal;
a second switch provided to the substrate and comprising a second source terminal, a second gate terminal, and a second drain terminal, the second source terminal being connected to the second input-and-output terminal, and the second drain terminal being connected to an output of the power amplifier; and a second voltage control circuit provided to the substrate apart from the first voltage control circuit and connected to the second gate terminal, wherein the power amplifier is connected between the first input-and-output terminal and the second input-and-output terminal, and wherein the power amplifier is connected in series between the first source terminal and the second drain terminal.

2. The switching circuit according to claim 1, wherein a distance between the first voltage control circuit and the first switch is shorter than a distance between the first voltage control circuit and the second switch.

3. The switching circuit according to claim 1, wherein a distance between the second voltage control circuit and the second switch is shorter than a distance between the second voltage control circuit and the first switch.

4. The switching circuit according to claim 1, wherein the first voltage control circuit is configured to apply a first gate voltage to the first gate terminal, and wherein the second voltage control circuit is configured to apply a second gate voltage to the second gate terminal, the second gate voltage being at a same level as the first gate voltage and in synchronization with the first gate voltage.

5. The switching circuit according to claim 1, further comprising:
a first low pass filter provided to the substrate and connected between the first voltage control circuit and the first gate terminal; and
a second low pass filter provided to the substrate and connected between the second voltage control circuit and the second gate terminal.

6. The switching circuit according to claim 1, further comprising:
a first input logic circuit provided to the substrate and connected to the first voltage control circuit; and
a second input logic circuit provided to the substrate apart from the first input logic circuit and connected to the second voltage control circuit.

7. The switching circuit according to claim 1, further comprising:
a low noise amplifier provided to the substrate;
a third switch provided to the substrate and comprising a third source terminal, a third gate terminal, and a third drain terminal, the third source terminal being connected to the first input-and-output terminal, and the third drain terminal being connected to an output of the low noise amplifier;
a third voltage control circuit provided to the substrate and connected to the third gate terminal;
a fourth switch provided to the substrate and comprising a fourth source terminal, a fourth gate terminal, and a fourth drain terminal, the fourth source terminal being connected to an input of the low noise amplifier, and the fourth drain terminal being connected to the second input-and-output terminal; and
a fourth voltage control circuit provided to the substrate apart from the third voltage control circuit and connected to the fourth gate terminal.

8. The switching circuit according to claim 7, wherein a distance between the third voltage control circuit and the third switch is shorter than a distance between the third voltage control circuit and the fourth switch.

9. The switching circuit according to claim 7, wherein a distance between the fourth voltage control circuit and the fourth switch is shorter than a distance between the fourth voltage control circuit and the third switch.

10. The switching circuit according to claim 7, wherein the third voltage control circuit is configured to apply a third gate voltage to the third gate terminal, and wherein the fourth voltage control circuit is configured to apply a fourth gate voltage to the fourth gate terminal, the fourth gate voltage being at a same level as the third gate voltage and in synchronization with the third gate voltage.

11. The switching circuit according to claim 7, further comprising:
a third low pass filter connected between the third voltage control circuit and the third gate terminal; and
a fourth low pass filter connected between the fourth voltage control circuit and the fourth gate terminal.

12. A switching circuit of an SPnT type, the switching circuit comprising:
a substrate comprising a common terminal, a first selection terminal, and a second selection terminal;
a first switch provided to the substrate and comprising a first source terminal, a first gate terminal, and a first drain terminal, the first drain terminal being connected to the common terminal, and the first source terminal being connected to the first selection terminal;
a first voltage control circuit provided to the substrate and connected to the first gate terminal;
a second switch provided to the substrate and comprising a second source terminal, a second gate terminal, and a second drain terminal, the second drain terminal being connected to the common terminal, the second source terminal being connected to the second selection terminal; and
a second voltage control circuit provided to the substrate apart from the first voltage control circuit and connected to the second gate terminal,
wherein a distance between the first voltage control circuit and the first switch is shorter than a distance between the first voltage control circuit and the second switch, or wherein a distance between the second voltage control circuit and the second switch is shorter than a distance between the second voltage control circuit and the first switch.

13. The switching circuit according to claim 12,
wherein the first voltage control circuit is configured to apply a first gate voltage to the first gate terminal, and
wherein the second voltage control circuit is configured to apply a second gate voltage to the second gate terminal, the second gate voltage being at an opposite level from the first gate voltage and in synchronization with the first gate voltage.

14. The switching circuit according to claim 12, further comprising:
a third switch provided to the substrate and comprising a third source terminal, a third gate terminal, and a third drain terminal, the third drain terminal being connected to a path between the first source terminal and the first selection terminal, and the third source terminal being connected to ground; and
a fourth switch provided to the substrate and comprising a fourth source terminal, a fourth gate terminal, and a fourth drain terminal, the fourth drain terminal being connected to a path between the second source terminal and the second selection terminal, and the fourth source terminal being connected to ground,
wherein the first voltage control circuit is further connected to the third gate terminal, and wherein the second voltage control circuit is further connected to the fourth gate terminal.

15. The switching circuit according to claim 14, wherein a distance between the first voltage control circuit and the third switch is shorter than a distance between the first voltage control circuit and the fourth switch.

16. The switching circuit according to claim 14, wherein a distance between the second voltage control circuit and the fourth switch is shorter than a distance between the second voltage control circuit and the third switch.

17. The switching circuit according to claim 14,
wherein the first voltage control circuit is configured to apply a first gate voltage to the first gate terminal, and is configured to apply a third gate voltage to the third gate terminal, the third gate voltage being at an opposite level from the first gate voltage and in synchronization with the first gate voltage, and
wherein the second voltage control circuit is configured to apply a second gate voltage to the second gate terminal, the second gate voltage being at an opposite level from the first gate voltage and in synchronization with the first gate voltage, and is configured to apply a fourth gate voltage to the fourth gate terminal, the fourth gate voltage being at an opposite level from the second gate voltage and in synchronization with the second gate voltage.

* * * * *